(12) United States Patent
Lin et al.

(10) Patent No.: US 9,443,869 B2
(45) Date of Patent: Sep. 13, 2016

(54) SYSTEMS AND METHODS FOR A SEMICONDUCTOR STRUCTURE HAVING MULTIPLE SEMICONDUCTOR-DEVICE LAYERS

(71) Applicant: Taiwan Semiconductor Manufacturing Company Limited, Hsinchu (TW)

(72) Inventors: Yi-Tang Lin, Hsinchu (TW); Chun-Hsiung Tsai, Hsinchu County (TW); Clement Hsingjen Wann, New York, NY (US)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 137 days.

(21) Appl. No.: 14/072,011

(22) Filed: Nov. 5, 2013

(65) Prior Publication Data

US 2015/0123202 A1     May 7, 2015

(51) Int. Cl.
| | |
|---|---|
| *H01L 21/12* | (2006.01) |
| *H01L 27/12* | (2006.01) |
| *H01L 29/66* | (2006.01) |
| *H01L 21/84* | (2006.01) |
| *H01L 21/822* | (2006.01) |
| *H01L 27/06* | (2006.01) |

(52) U.S. Cl.
CPC ....... *H01L 27/1203* (2013.01); *H01L 21/8221* (2013.01); *H01L 21/84* (2013.01); *H01L 27/0688* (2013.01); *H01L 29/66477* (2013.01)

(58) Field of Classification Search
CPC ............... H01L 27/1207; H01L 27/0688; H01L 29/165; H01L 2924/1305; H01L 21/84; H01L 27/1211

USPC ................ 257/351, 350, 192, E29.002; 438/153–154
See application file for complete search history.

(56) References Cited

U.S. PATENT DOCUMENTS

| | | | |
|---|---|---|---|
| 7,723,851 B2 * | 5/2010 | La Tulipe, Jr. ... | H01L 21/76802 257/758 |
| 2005/0067620 A1 | 3/2005 | Chan et al. | |
| 2006/0033110 A1 | 2/2006 | Alam et al. | |
| 2008/0283958 A1 * | 11/2008 | Ohnuma ............. | H01L 27/1214 438/150 |
| 2009/0224364 A1 * | 9/2009 | Oh ...................... | H01L 21/2007 438/107 |
| 2011/0091685 A1 * | 4/2011 | Farooq ................ | B32B 3/02 428/141 |
| 2011/0143506 A1 * | 6/2011 | Lee ..................... | H01L 23/481 438/238 |
| 2012/0003808 A1 * | 1/2012 | Lee ..................... | H01L 27/105 438/381 |
| 2013/0082235 A1 * | 4/2013 | Gu ...................... | H01L 21/8258 257/499 |

OTHER PUBLICATIONS

Taiwanese Office Action; Application No. 103110841; dated Oct. 21, 2015.

* cited by examiner

*Primary Examiner* — David Vu
*Assistant Examiner* — Jonathan Han
(74) *Attorney, Agent, or Firm* — Jones Day

(57) ABSTRACT

A multilayer semiconductor device structure comprising a first buried oxide and a first semiconductor device layer fabricated above the first buried oxide is provided. The first semiconductor device layer comprises a patterned top surface. The patterned surface comprises insulator material and conductor material. The surface density of the insulator material is greater than 40 percent. The multilayer semiconductor device structure further comprises a second buried oxide bonded to the patterned surface of the first semiconductor device layer and a second semiconductor device layer fabricated above the second buried oxide.

20 Claims, 36 Drawing Sheets

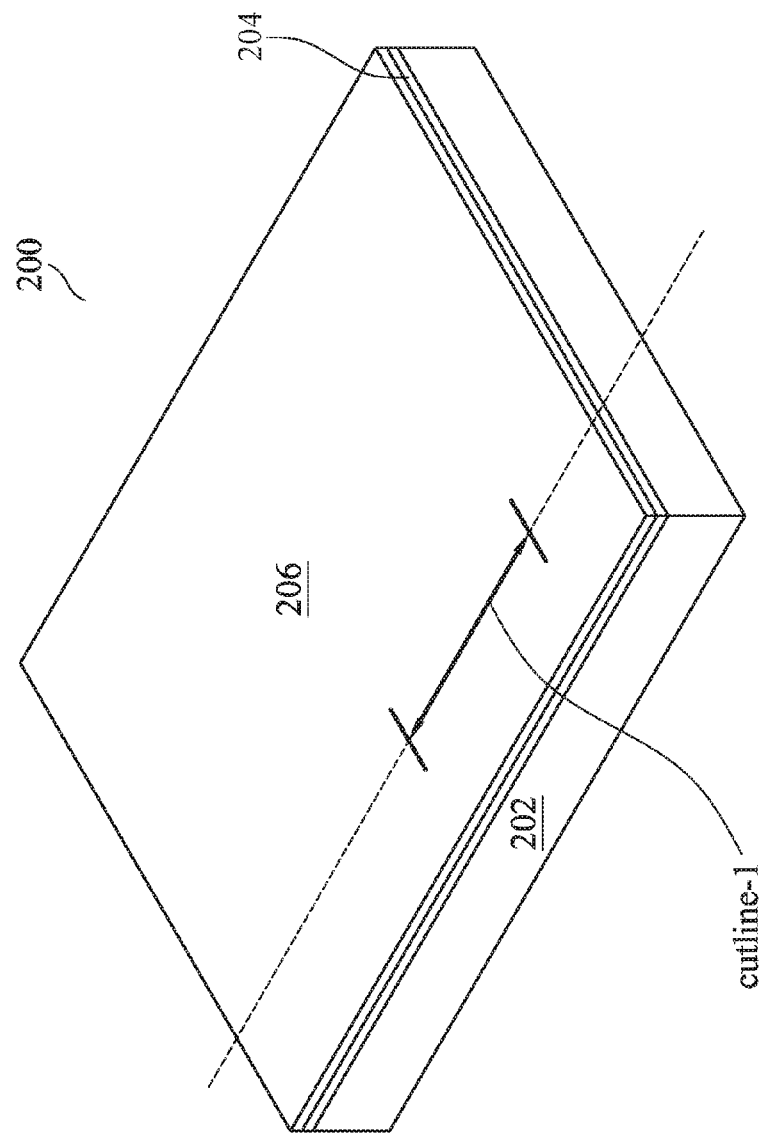

SYSTEMS AND METHODS FOR A SEMICONDUCTOR STRUCTURE HAVING MULTIPLE SEMICONDUCTOR-DEVICE LAYERS

FIELD

The technology described in this patent document relates generally to semiconductor devices and more particularly to a semiconductor structure having multiple semiconductor device layers.

BACKGROUND

Integrated circuits ("ICs") may comprise one or more types of semiconductor devices such as n-channel MOSFET ("NMOS") devices, p-channel MOSFET ("PMOS") devices, bipolar junction transistor ("BJT") devices, diode devices, and capacitors devices among others. Different types of devices can present different design considerations for a semiconductor designer. ICs may also include circuits that have different circuit functions such as ICs having analog functions, logic functions and memory functions.

SUMMARY

In accordance with the teachings described herein, provided are a semiconductor structure having multiple semiconductor device layers and a method for fabricating a multilevel semiconductor device structure. In one example, a multilayer semiconductor device structure comprises a first buried oxide and a first semiconductor device layer fabricated above the first buried oxide. The first semiconductor device layer comprises a patterned top surface. The patterned surface comprises insulator material and conductor material. The pattern density of the insulator material is greater than 40 percent. The multilayer semiconductor device structure further comprises a second buried oxide bonded to the patterned surface of the first semiconductor device layer and a second semiconductor device layer fabricated above the second buried oxide.

In another example, a method of fabricating a multilayer semiconductor device structure is provided. The method comprises providing a first wafer comprising first channel material bonded to a first buried oxide layer and fabricating a first semiconductor device layer from the first channel material. The first semiconductor device layer comprises a patterned top surface. The patterned surface comprises insulator material and conductor material. The pattern density of the insulator material is greater than 40 percent. The method further comprises providing a second wafer comprising second channel material bonded to a second buried oxide layer, bonding the second buried oxide to the patterned surface of the first semiconductor device layer, fabricating a second semiconductor device layer from the second channel material, and interconnecting a feature of the first semiconductor device with a feature of the second semiconductor device.

In yet another example, a method of fabricating a multi-layer semiconductor device structure is provided. The method comprises providing a first silicon on insulator (SOI) wafer comprising first channel material bonded to a first buried oxide layer and fabricating a first semiconductor device layer from the first channel material. The first semiconductor device layer comprises a patterned top surface. The patterned surface comprises insulator material and conductor material. The pattern density of the conductor material is less than 57 percent. The method further comprises providing a second SOI wafer comprising second channel material bonded to a second buried oxide layer, bonding the second buried oxide to the patterned surface of the first semiconductor device layer, and fabricating a second semiconductor device layer from the second channel material.

BRIEF DESCRIPTION OF THE DRAWINGS

FIG. 6A depicts an isometric view of an example SOI wafer that may be provided for use with the methods described in this document.

DETAILED DESCRIPTION

Figure 1:
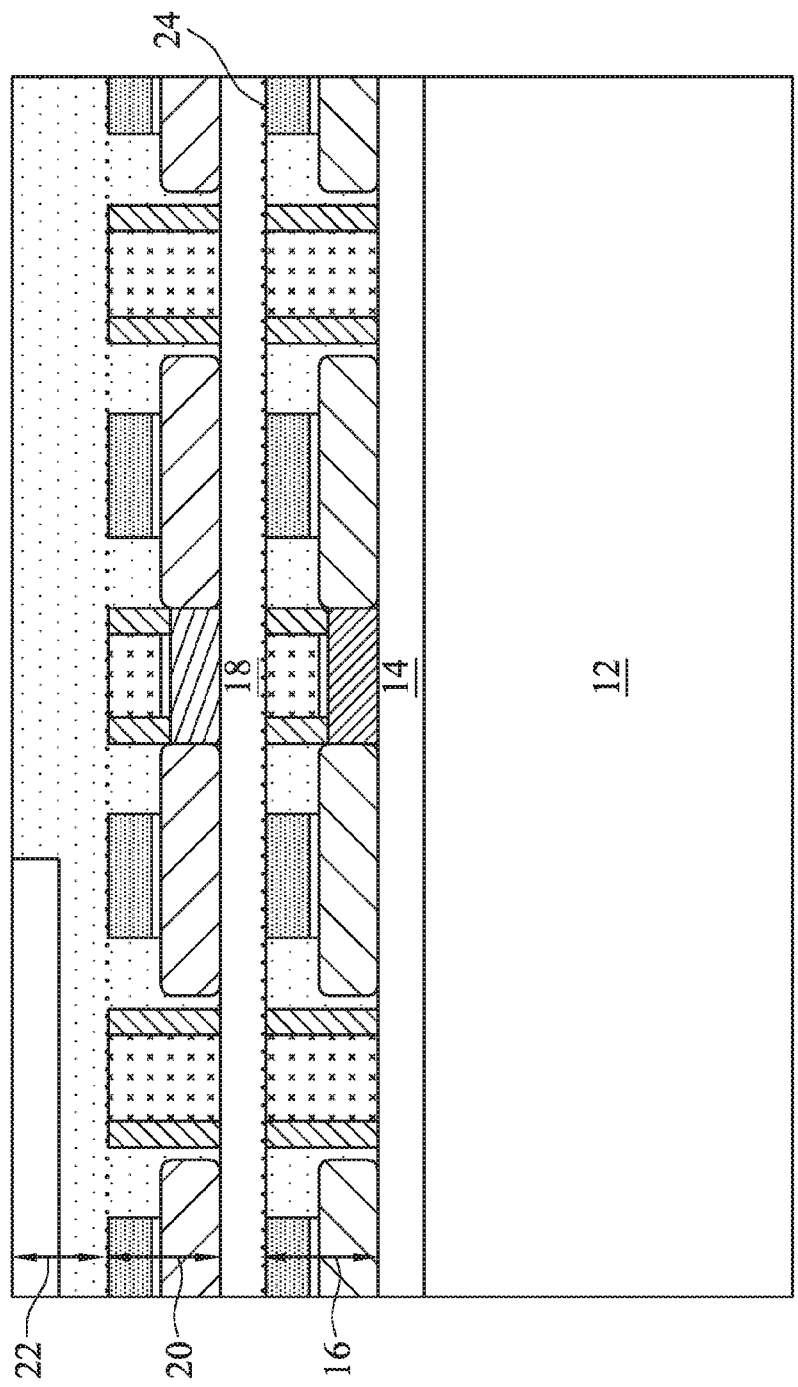
FIG. 1 is a cross-sectional view of an example semiconductor structure having multiple transistor layers.

Depicted in FIG. 1 is a cross-sectional view of an example semiconductor structure 10 having multiple transistor layers. The semiconductor structure comprises a substrate 12, a first buried oxide layer 14 above the substrate 12, a first transistor layer 16 above the buried oxide 14, a second buried oxide layer 18 above the first transistor layer 16, a second transistor layer 20 above the second buried oxide 18, and a back-end-of-line ("BEOL") layer 22 above the second transistor layer 20. The first transistor layer 16 comprises multiple components such as source regions, drain regions, and gate regions of transistors, ILD0 oxide, nitride spacers, and metal material. The top surface of the first transistor layer 16 is a patterned surface 24 comprising ILD0 oxide, nitride spacer material, gate material, and metal material arranged in a predetermined pattern.

The patterned surface 24 is arranged in a manner that allows for the second buried oxide layer 18 to be bonded thereto without the need for a glue/buffer region between the patterned surface 24 and the second buried oxide layer 18. By appropriately designing and controlling the pattern densities of gate material, the M0 metal material, and the ILD0 oxide on the top surface of first device layer 16, the atom link between the buried oxide and top surface 24 of first device layer may be sufficiently strong without depositing an additional blanket glue/buffer layer on the top of first device layer for strengthening the bonding surface. An appropriately arranged patterned surface may simplify the bonding process because the depositing of a glue/buffer layer may not be needed. Additionally, the depth of contact hole etching and filling from M1 to first gate and from M1 to first M0 may be reduced, thereby reducing the process difficulty, as a result of not adding the thickness of a glue/buffer oxide layer.

Bonding a second buried oxide to a patterned surface may be accomplished because the buried oxide and first ILD0 oxide are homogeneous materials (oxide-based) and the atom link between these two materials is strong. The buried oxide and first gate metal and M0 metal, on the other hand, are non-homogeneous materials (insulator to conductor, such as oxide to metal) and the atom link between these two materials will not be as strong. In addition, typical metal gate CMP and M0 CMP will stop at the surface of ILD0 oxide and may produce a dishing effect in the gate and M0 metal region. It may also degrade the bonding strength between buried oxide and first gate and M0.

Therefore, the pattern density of the ILD0 oxide region (insulator region), the gate region (Type-I conductor region), and the M0 metal region (Type-II conductor region) should be arranged to ensure sufficient bonding strength without the need for a glue layer. In the example illustrated, the pattern density for the gate region is less than 28% and the pattern density for the M0 region is less than 29%. Alternatively, the pattern density of the ILD0 oxide region can be greater than 40%. Meeting these pattern density ratios should allow for the bonding of two transistor layers without the need for a glue/buffer region.

Additionally, using a high-k first or a non-high-k gate stack for the first transistor level can also increase the atom link at the bonding interface. This configuration can result in an increased ratio of ILD0 oxide in the bonding surface and enhance the atom link between bonding interface.

Figure 2:
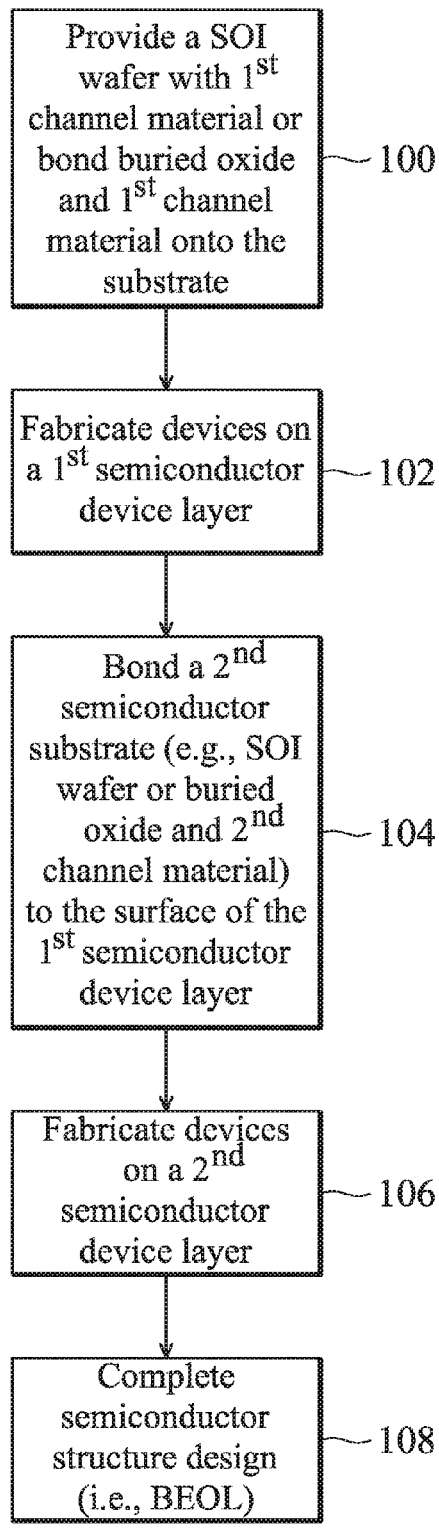
FIG. 2 is a process flow chart depicting an example method for creating a multi-layer semiconductor structure having two semiconductor device (or transistor) layers.

FIG. 2 is a process flow chart depicting an example method for creating a multi-layer semiconductor structure having two semiconductor device (or transistor) layers. At operation 100, a first semiconductor-on-insulator ("SOI") wafer with a first channel material is provided for the first layer. Alternatively, at operation 100, a substrate with bond buried oxide and the first channel material may be provided.

At operation 102, the first transistor layer is fabricated. The first transistor layer may be fabricated using suitable processes including photolithography, etching, cleaning, chemical mechanical polishing/planarization ("CMP"), thin film deposition, thermal process (e.g., doping, activation/surface, passivation/material consolidation), epitaxy, and material filling, among others. For example, the photolithography process may include forming a photoresist layer (resist), exposing the resist to a pattern, performing post-exposure bake processes, and developing the resist to form a masking element. The masking element may then be used in an etching process. The etching may be performed using reactive ion etch ("RIE") and/or other suitable processes. The fabrication of the first level comprises designing the layer such that the pattern density of the ILD0 oxide region is greater than 40%. Alternatively, fabrication of the first level comprises designing the layer such that the pattern density for the gate region is less than 28% and the pattern density for the M0 region is less than 29%.

After the devices on the first semiconductor layer are fabricated, a second semiconductor substrate is provided and bonded to the patterned top surface of the first semiconductor device layer (operation 104). The second semiconductor substrate comprises a semiconductor on insulator ("SOI") substrate. The bottom surface of the insulator of the SOI substrate is bonding to the top surface of the first semiconductor layer. In some embodiments, the bonding surface of the insulator and patterned surface of the first semiconductor layer are processed to clean, remove excess particles, and make the surfaces hydrophobic or hydrophilic. After the surfaces are processed, the wafer containing the first semiconductor layer and the wafer containing the SOI substrate are aligned. After alignment the layers can be bonded through a touch and press process. The Van der Waals force will link the atoms of the interface between the bottom of the second semiconductor layer and the top of the first semiconductor layer together (this process may involve some plasma enhancement technique). Also a thermal procedure can be applied to enhance the linking of atoms at the interface. The resultant semiconductor structure can have a planarization process or CMP process applied to reduce the thickness of second semiconductor layer to the required thickness (e.g., 5-20 nm, the channel thickness of the second device).

After bonding, a second semiconductor device layer is fabricated on the second semiconductor substrate (operation 106). The second semiconductor layer may be fabricated using a number of using suitable processes including photolithography, etching, cleaning, chemical mechanical polishing/planarization ("CMP"), thin film deposition, thermal process, epitaxy, and material filling, among others.

The second semiconductor substrate has a semiconductor on insulator ("SOI") structure comprising a buried oxide and a second channel material. The buried oxide functions as an electrical insulator underneath the semiconductor channel material. The buried oxide may be formed from material such as $SiO_2$, HfO, $Al_2O_3$ or other suitable oxide material. The electrical insulator functions to insulate the second channel material in the second semiconductor substrate from the devices formed on the first semiconductor device layer.

The second channel material may be formed from material such as Si, SiGe, GaAs, or others. The second channel material may be the same as or different from the semiconductor channel material used in the first semiconductor device layer. This can allow for selectively constructing certain semiconductor devices with the channel material of the first semiconductor substrate and other semiconductor devices with the channel material of the second semiconductor substrate. For example, the channel material of the first semiconductor substrate may be Ge and used for fabricating PMOS devices, and the channel material of the second semiconductor substrate may be GaAs and used for fabricating NMOS devices for boosting the performance of NMOS and PMOS transistors.

After fabricating the second semiconductor device layer, the semiconductor structure can be completed (operation 108). Completion comprises back end of line ("BEOL") operations where the individual devices are interconnected with wiring on the multi-layer semiconductor structure. BEOL may include fabrication of contacts, insulating layers (dielectrics), metal levels, and bonding sites for chip-to-package connections.

Figure 3:
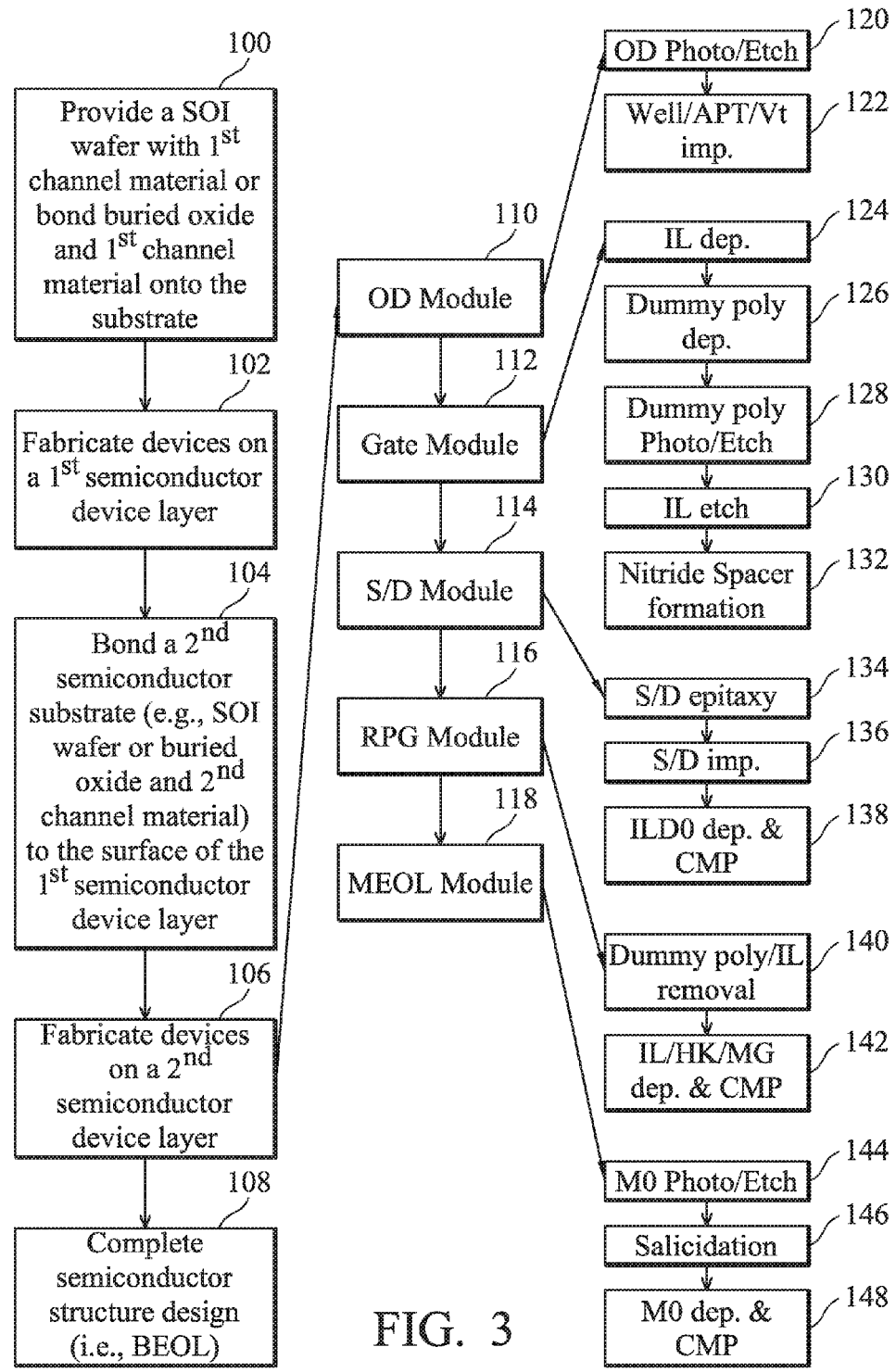
FIG. 3 is a process flow chart depicting another example method for creating a multi-layer semiconductor structure having two semiconductor device layers.

FIG. 3 is a process flow chart depicting another example method for creating a multi-layer semiconductor structure having two semiconductor device layers. This example method comprises providing a SOI wafer or bond buried oxide and first channel material on a substrate (operation 100), fabricating the first semiconductor layer with an exposed patterned top surface (operation 102), bonding the bottom insulator surface of a SOI substrate (or bond buried oxide and channel material) to the top patterned surface of the first semiconductor layer (operation 104), fabricating the second device layer on the SOI substrate (operation 106), and completing the semiconductor structure with wiring and metallization layers (operation 108). The example method of FIG. 3 is similar to the example method of FIG. 2, but provides specific examples regarding how the first semiconductor layer may be fabricated.

In particular, fabrication of devices in the first semiconductor device layer, in this example, comprises an oxidation ("OD") module process (operation 110), a gate module process (operation 112), a source/drain module process (operation 114), a remove poly gate module process (operation 116), and a middle end of line ("MEOL") module process (operation 118).

Figure 6B:
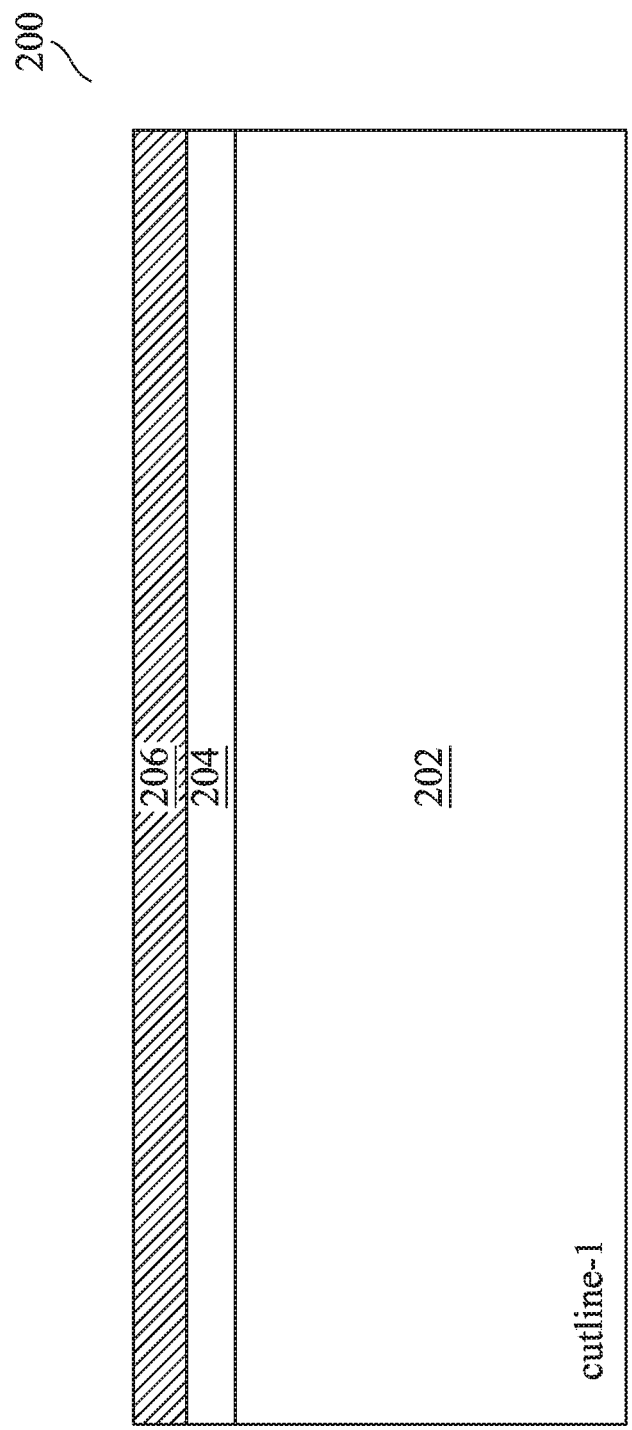
FIG. 6B provides a cross-sectional view of the semiconductor structure from cutline 1 of FIG. 6A.

FIG. 6A depicts an isometric view of an example SOI wafer 200 that may be provided for use with the methods described in FIG. 3 to fabricate a multi-layer semiconductor structure. FIG. 6B provides a cross-sectional view of the semiconductor structure from cutline 1 of FIG. 6A. The SOI wafer 200 comprises a silicon substrate 202 with a buried oxide layer 204 and first channel material 206 above the buried oxide layer 204. The first channel material may comprise Ge with N-well implantation. The buried oxide layer 204 may be formed from material such as $SiO_2$, $HfO_2$, $Al_2O_3$ or other suitable oxide material.

Referring back to FIG. 3, the OD module process (operation 110) may comprise a number of iterations of isolation oxide deposition and planarizing, photolithography and etching operations (operation 120), and diffusion/ion implantation operations (operation 122) such as P-well or N-well implantation, $P^+$ implantation, and $N^+$ implantation.

Figure 7A:
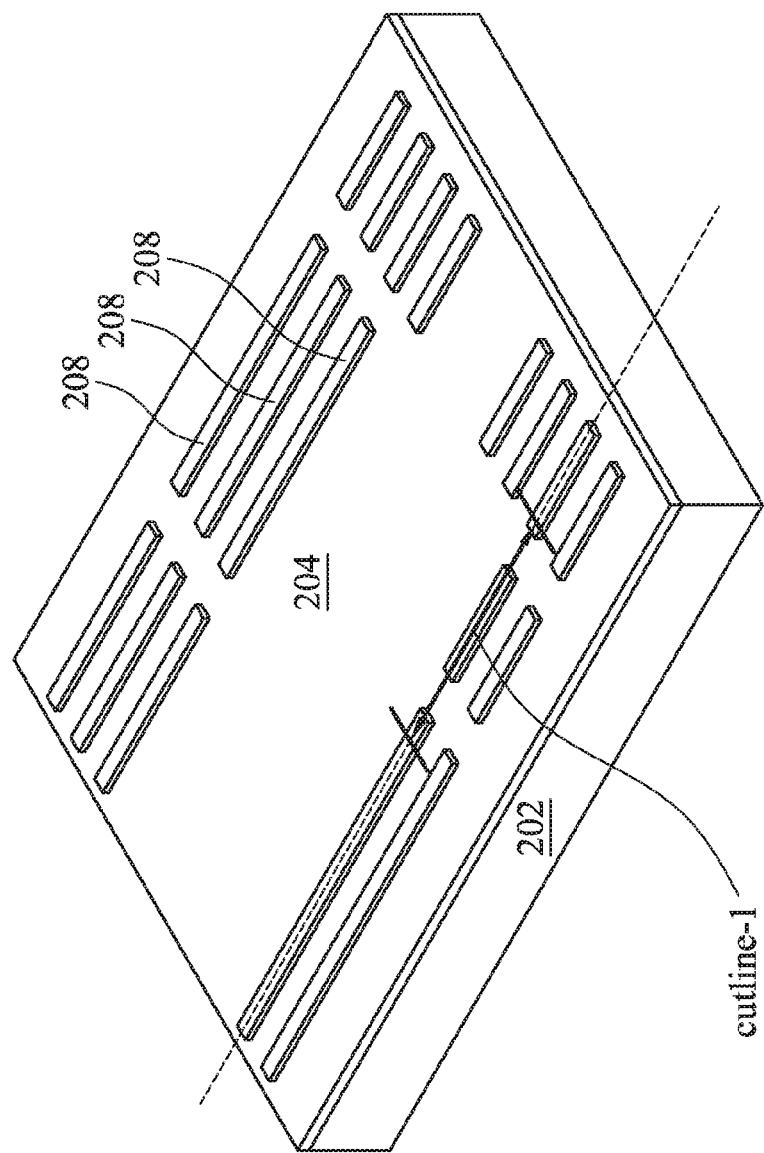
FIG. 7A depicts an isometric view of an example semiconductor structure after completion of the OD module process.
Figure 7B:
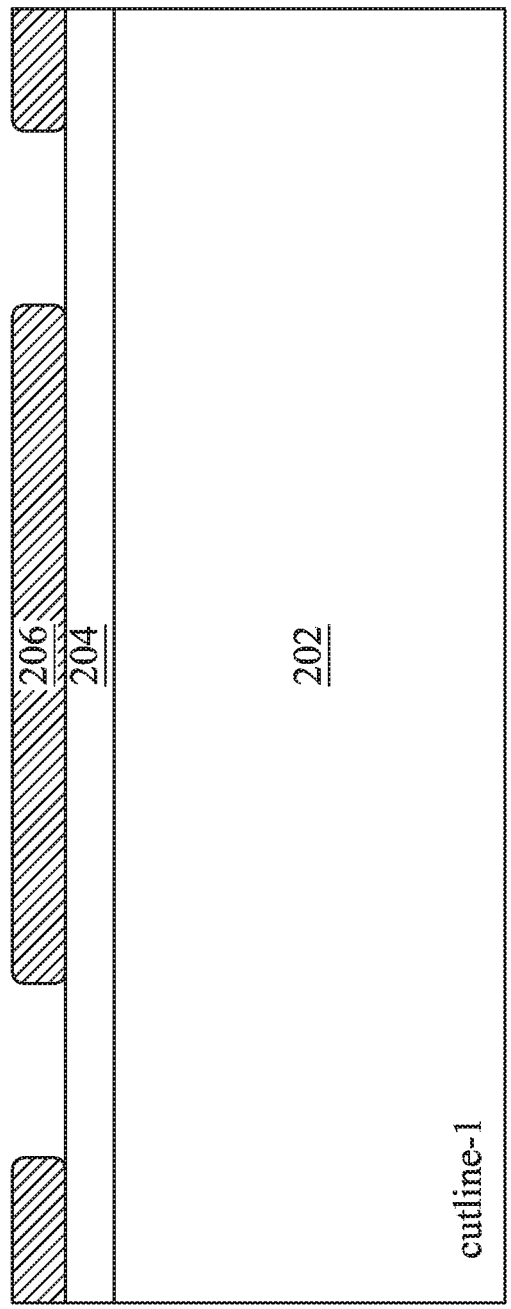
FIG. 7B provides a cross-sectional view of the semiconductor structure from cutline 1 of FIG. 7A.

FIG. 7A depicts an isometric view of the semiconductor structure after completion of the OD module process (operation 110 of FIG. 3). FIG. 7B provides a cross-sectional view of the semiconductor structure from cutline 1 of FIG. 7A. Shown are OD fins 206 for the PMOS transistor above the buried oxide layer 204, which in turn is above the substrate 202.

Referring back to FIG. 3, the gate module process (operation 112) comprises operations such as depositing isolation oxide material (operation 124), dummy poly deposition (operation 126), dummy poly photolithography/etching (operation 128), etching isolation oxide material (operation 130), and nitride spacer formation (operation 132).

Figure 8A:
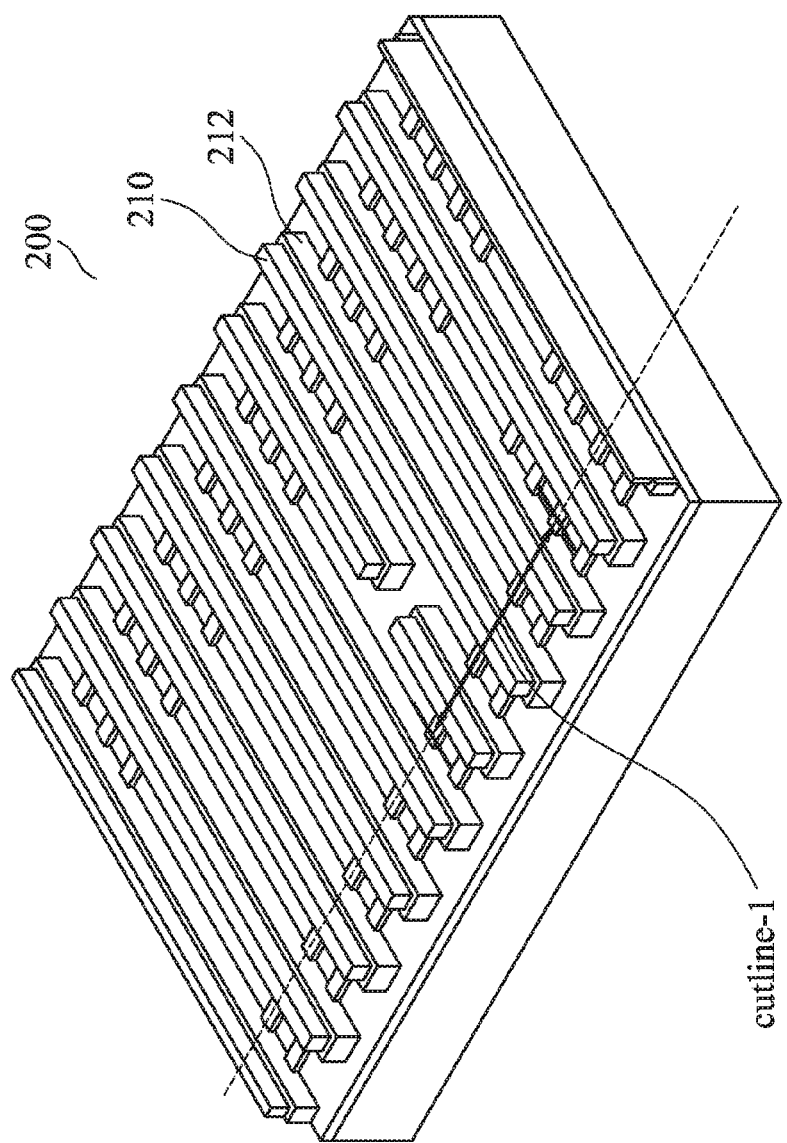
FIG. 8A depicts an isometric view of an example SOI wafer after completion of the gate module process.
Figure 8B:
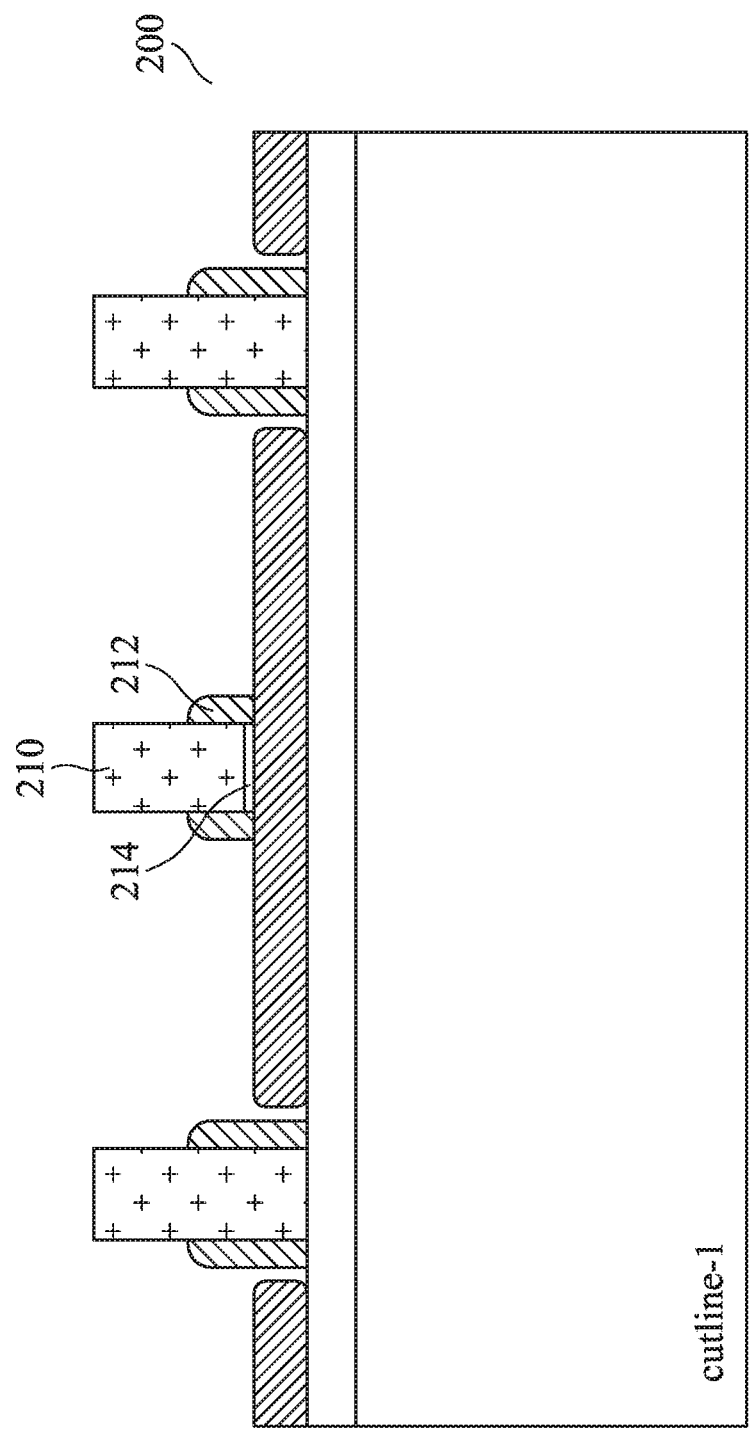
FIG. 8B provides a cross-sectional view of the semiconductor structure from cutline 1 of FIG. 8A.

FIG. 8A depicts an isometric view of the example SOI wafer 200 after completion of the gate module process (operation 112 of FIG. 3). FIG. 8B provides a cross-sectional view of the semiconductor structure from cutline 1 of FIG. 8A. Shown are dummy poly 210, nitride spacers 212, and dummy isolation oxide 214.

Referring back to FIG. 3, the source/drain module process (operation 114) may comprise source/drain epitaxial growth operations (operation 134), source/drain implantation operations (operation 136), and interlayer dielectric deposition and etching (operation 138).

Figure 9A:
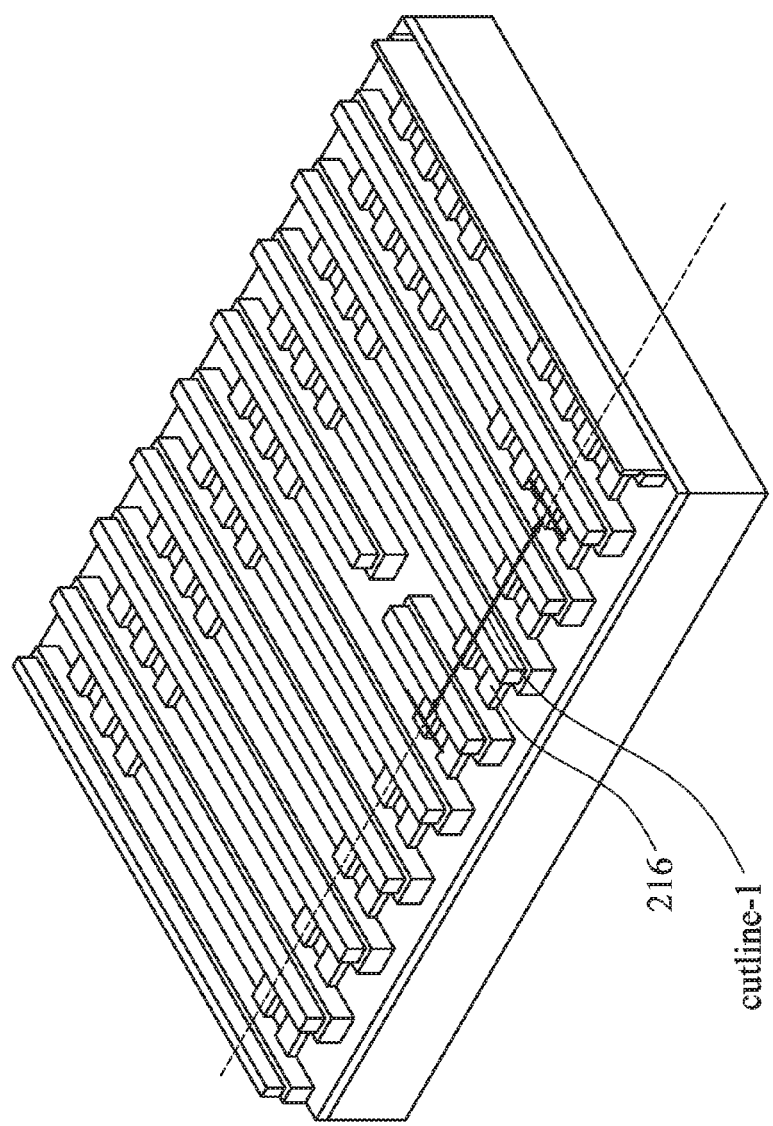
FIG. 9A depicts an isometric view of a semiconductor structure after source/drain epitaxial growth operations and source/drain implantation operations.
Figure 9B:
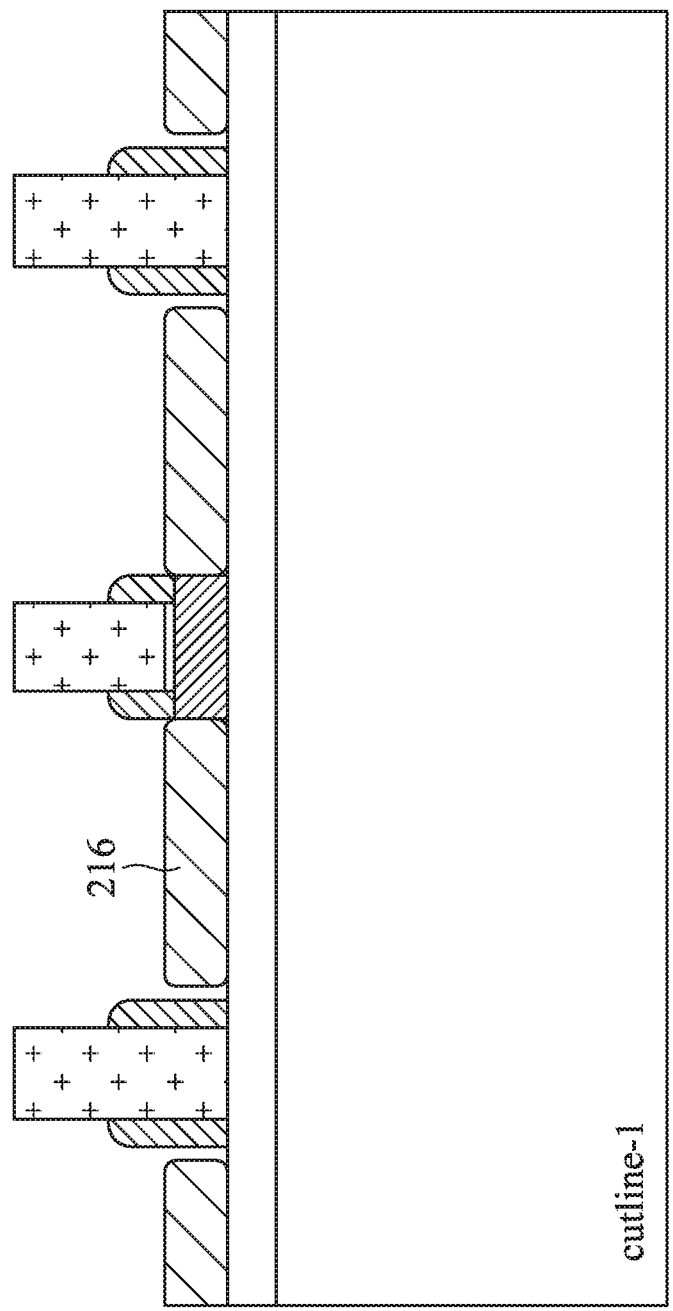
FIG. 9B provides a cross-sectional view of the semiconductor structure from cutline 1 of FIG. 9A.

FIG. 9A depicts an isometric view of the semiconductor structure after source/drain epitaxial growth operations (operation 134 of FIG. 3) and source/drain implantation operations (operation 136 of FIG. 3). FIG. 9B provides a cross-sectional view of the semiconductor structure from cutline 1 of FIG. 9A. Shown is the source/drain material 216 after epitaxy and implantation.

Figure 10A:
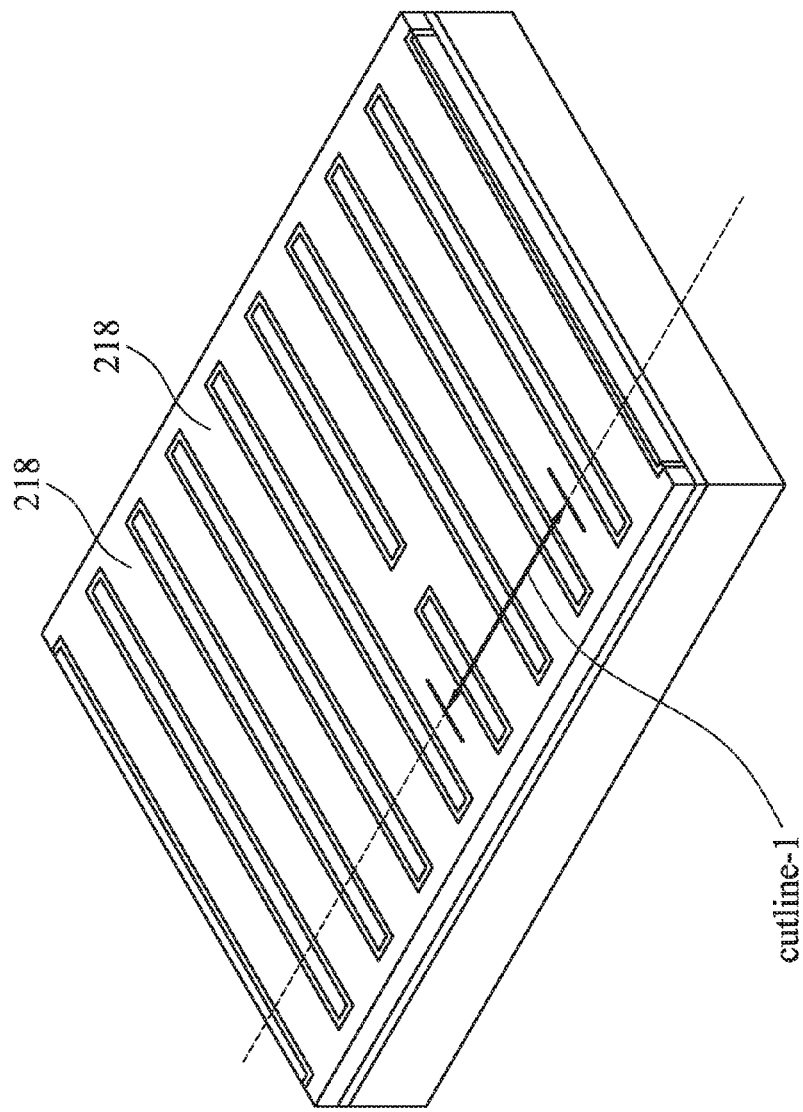
FIG. 10A depicts an isometric view of a semiconductor structure after interlayer dielectric deposition and etching.
Figure 10B:
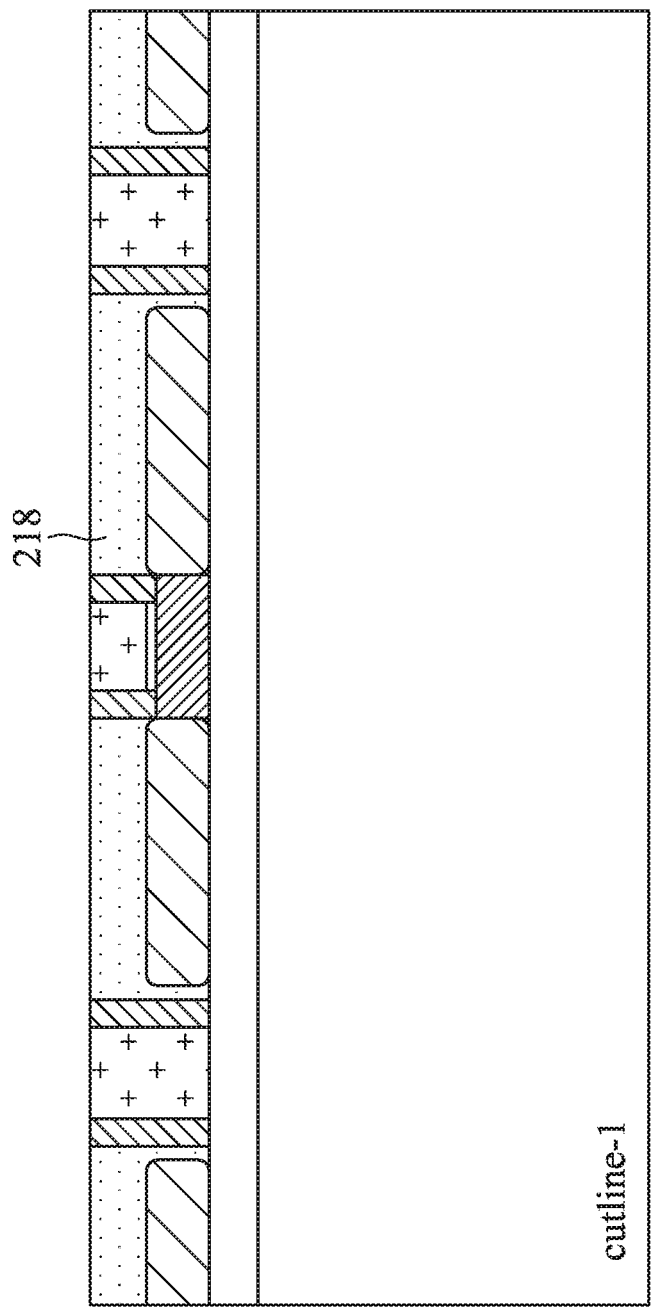
FIG. 10B provides a cross-sectional view of the semiconductor structure from cutline 1 of FIG. 10A.

FIG. 10A depicts an isometric view of the semiconductor structure after interlayer dielectric deposition and etching (operation 138 of FIG. 3). FIG. 10B provides a cross-sectional view of the semiconductor structure from cutline 1 of FIG. 10A. Shown is the deposited interlayer dielectric material 218.

Referring back to FIG. 3, the remove poly gate module process (operation 116) comprises dummy poly/isolation oxide removal (operation 140) and isolation oxide/high K/metal gate deposition and CMP (operation 142).

Figure 11A:
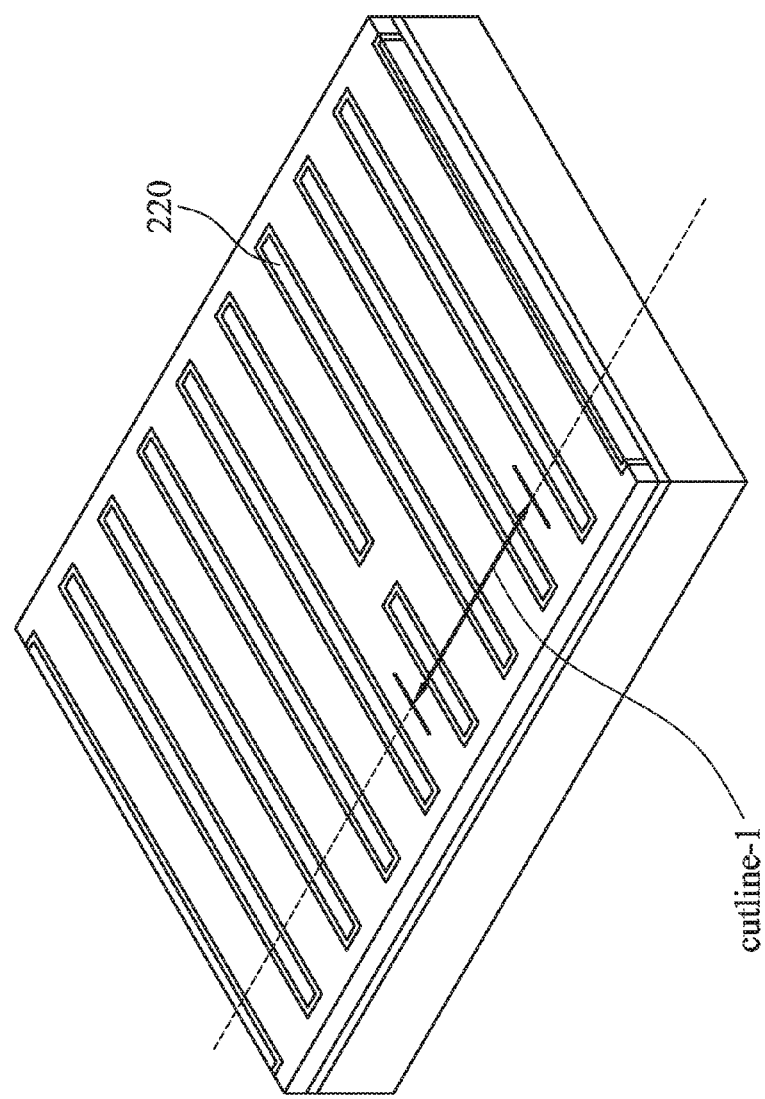
FIG. 11A depicts an isometric view of a semiconductor structure after dummy poly/isolation oxide removal and isolation oxide/high K/metal gate deposition and CMP.
Figure 11B:
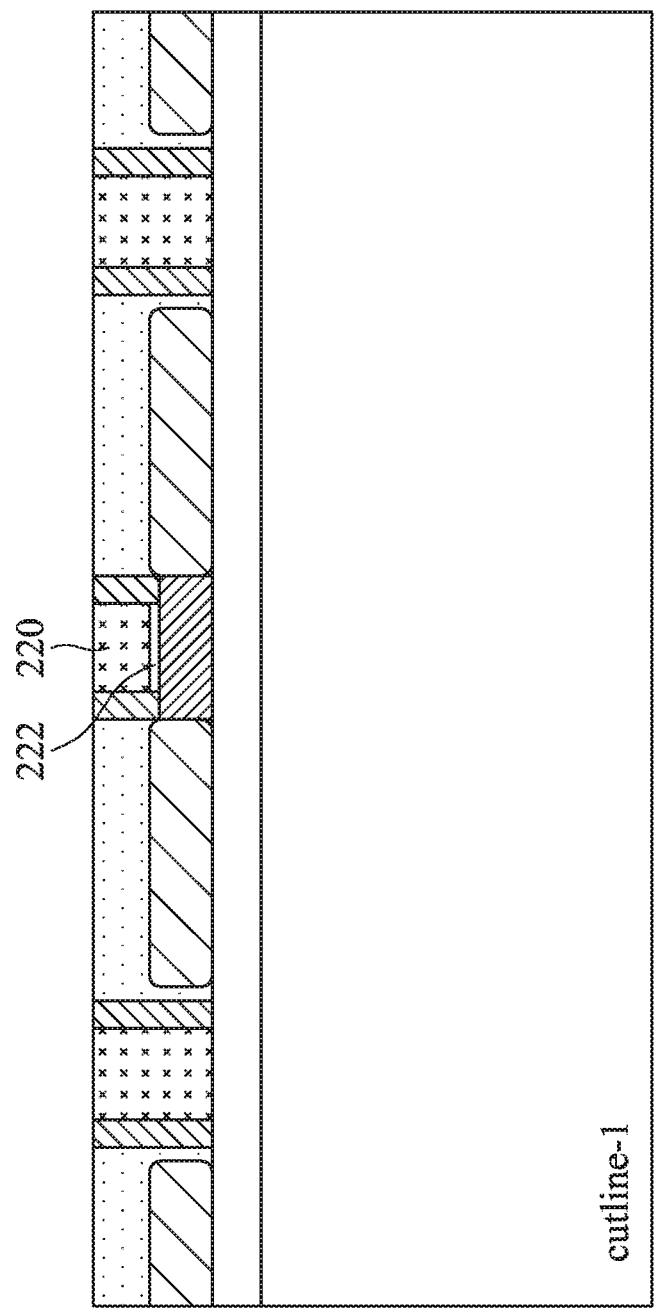
FIG. 11B provides a cross-sectional view of the semiconductor structure from cutline 1 of FIG. 11A.

FIG. 11A depicts an isometric view of the semiconductor structure after dummy poly/isolation oxide removal (operation 140 of FIG. 3) and isolation oxide/high K/metal gate deposition and CMP (operation 142 of FIG. 3). FIG. 11B provides a cross-sectional view of the semiconductor structure from cutline 1 of FIG. 11A. These figures show that the dummy poly material is replaced by metal gate material 220 such as Al or W and also shows that the dummy IL is replaced by IL/HK 222.

The MEOL module process (operation 122) may comprise M0 photolithography and etching operations (operation 144), salicidation (operation 146), and M0 deposition and CMP (operation 148).

Figure 12A:
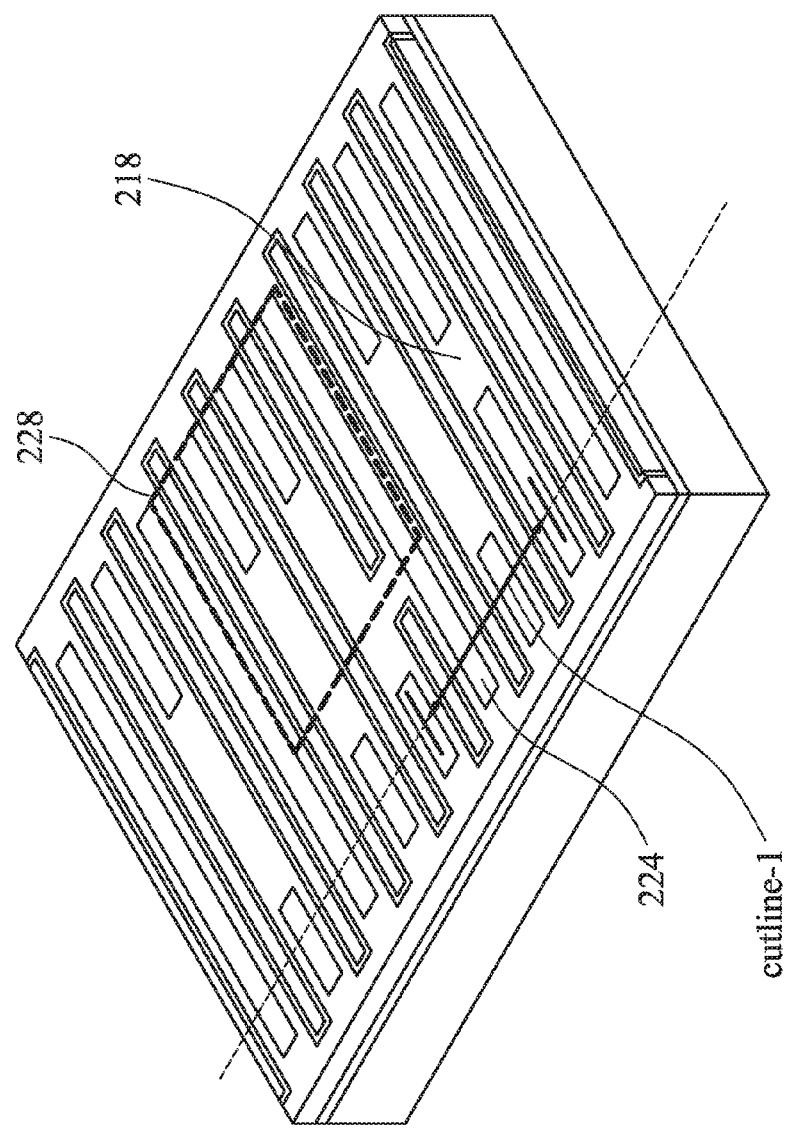
FIG. 12A depicts an isometric view of a semiconductor structure after a MEOL module process.
Figure 12B:
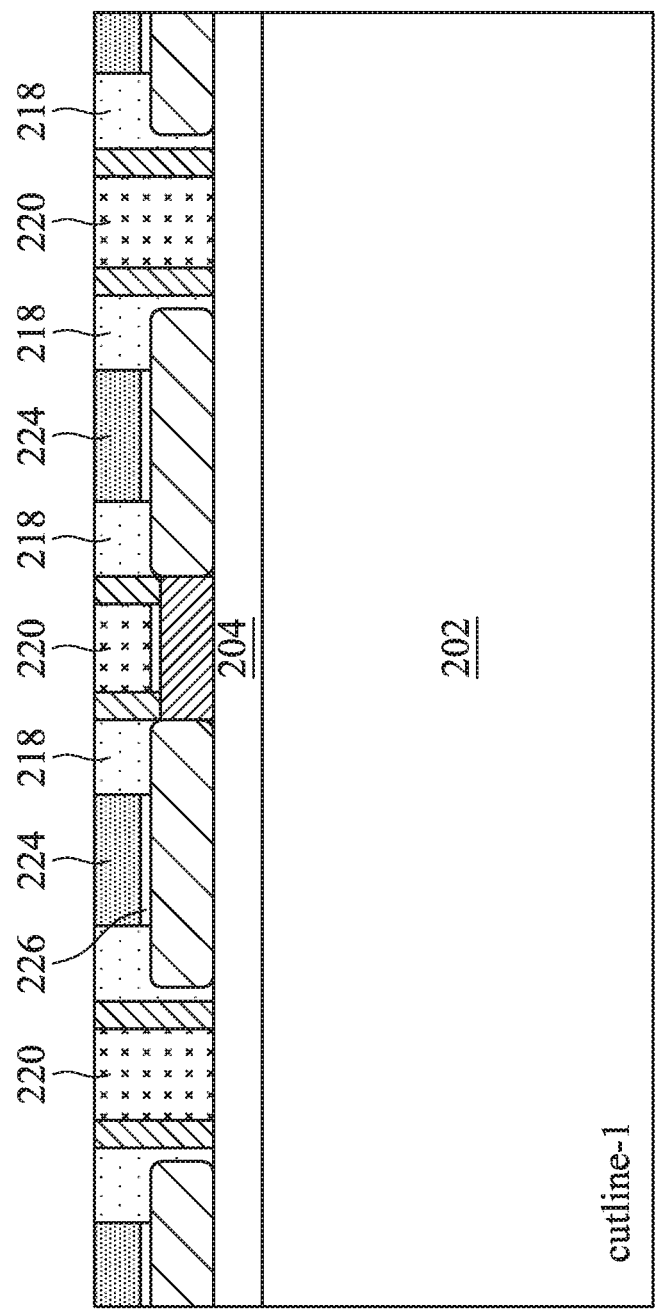
FIG. 12B provides a cross-sectional view of the semiconductor structure from cutline 1 of FIG. 12A.

FIG. 12A depicts an isometric view of the semiconductor structure after the MEOL module process (operation 122 of FIG. 3). FIG. 12B provides a cross-sectional view of the semiconductor structure from cutline 1 of FIG. 12A. These figures show the addition of M0 metal material 224 above source and drain regions and also shows that silicide 226 between the M0 metal and the source and drain regions.

The local density of the ILD0 oxide 218 throughout the chip as measured by an arbitrary 1 um×1 um rectangle 228 should be larger than 40%. The ILD0 oxide can provide a stronger atom link to the bonding surface. In this embodiment, M0 metal 224 and MG gate metal 220 are appropriately designed and surrounded by ILD0 oxide to avoid large regions without ILD0 oxide.

Figure 4:
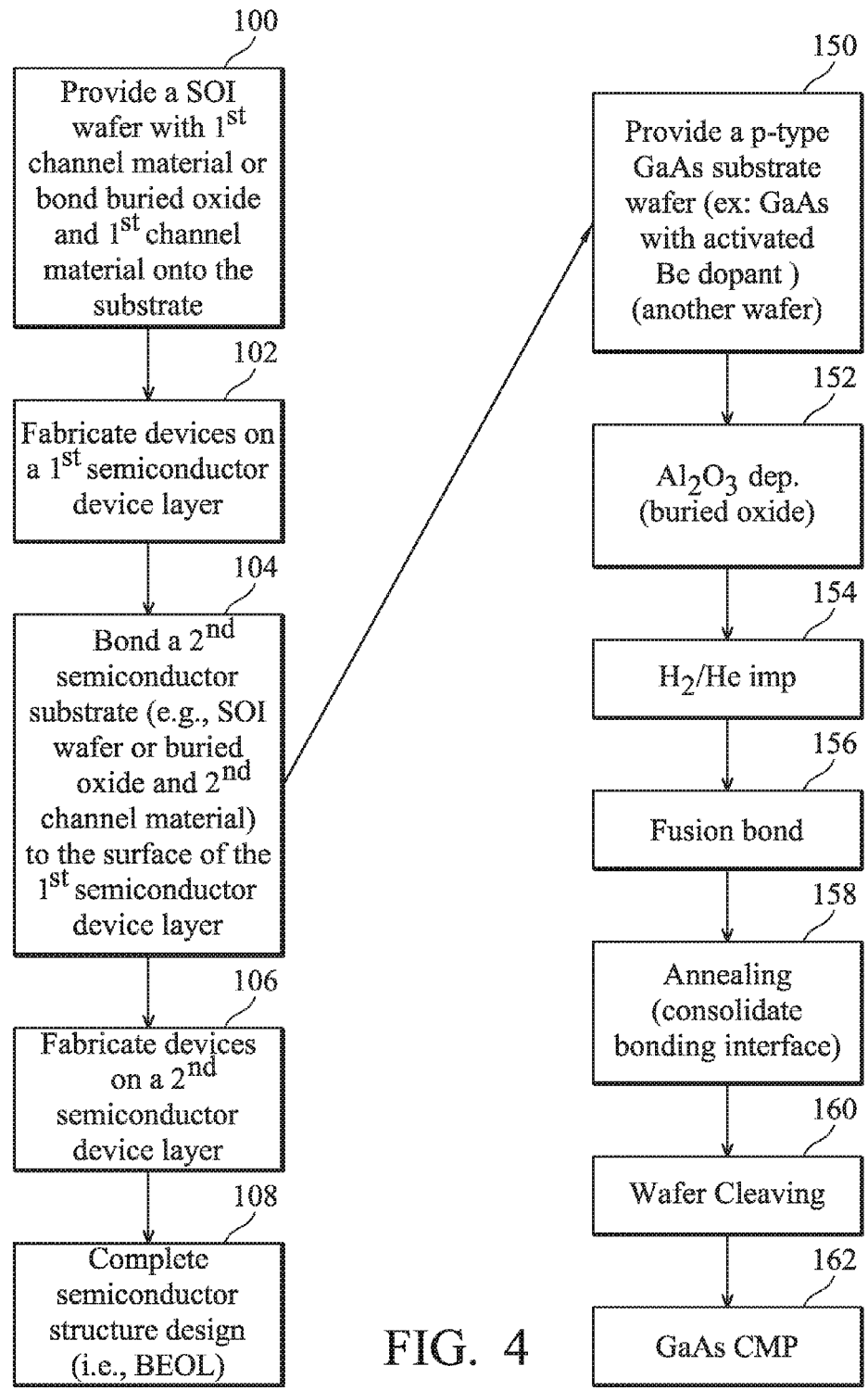
FIG. 4 is a process flow chart depicting another example method for creating a multi-layer semiconductor structure having two semiconductor device layers.

FIG. 4 is a process flow chart depicting another example method for creating a multi-layer semiconductor structure having two semiconductor device layers. This example method comprises providing a SOI wafer or bond buried oxide and first channel material on a substrate (operation 100), fabricating the first semiconductor layer with an exposed patterned top surface (operation 102), bonding the bottom insulator surface of a SOI substrate (or bond buried oxide and channel material) to the top patterned surface of the first semiconductor layer (operation 104), fabricating the second device layer on the SOI substrate (operation 106), and completing the semiconductor structure with wiring and metallization layers (operation 108). The example method of FIG. 4 is similar to the example method of FIG. 2, but provides specific examples regarding how the second semiconductor substrate may be bonded to the surface of the first semiconductor device.

In particular, referring to FIG. 4, bonding the bottom insulator surface of a SOI substrate (or bond buried oxide and channel material) to the top patterned surface of the first semiconductor layer, in this example, comprises providing a separate substrate (operation 150), which will provide the second channel material. As an example, the substrate may comprise GaAs with an activated Be dopant. The example further comprises depositing a defect free buried oxide layer (operation 152) onto the substrate. In this example, the buried oxide comprises Al2O3, HfO2, SiO2, or some other suitable oxide material. In this example, the thickness of this layer is about 10 nm~20 nm. The example further comprises H2/He implantation (operation 154). The deposited buried oxide and substrate are subjected to H2/He implantation to introduce the H2/He into the GaAs substrate to a level to weaken the interface atom linkage.

At operation 156, bonding the top surface of the buried oxide layer onto the top patterned surface of the first transistor level takes place. The surface of the buried oxide layer opposite the second channel material is bonded to the top patterned surface of the first transistor layer. The two bonding surfaces should be planarized to minimize the surface roughness and cleaned to remove particles before bonding. The example further comprises annealing operations to consolidate the bonding interface (operation 158). The example further comprises wafer cleaving (operation 160) at the H2/He implantation layer level. The substrate can be cleaved at the H2/He implantation layer level. The example further comprises GaAs CMP (operation 162) to reduce the size of the GaAs substrate. CMP for the GaAs channel material is undertaken to get the second channel material to a targeted thickness.

Figure 13A:
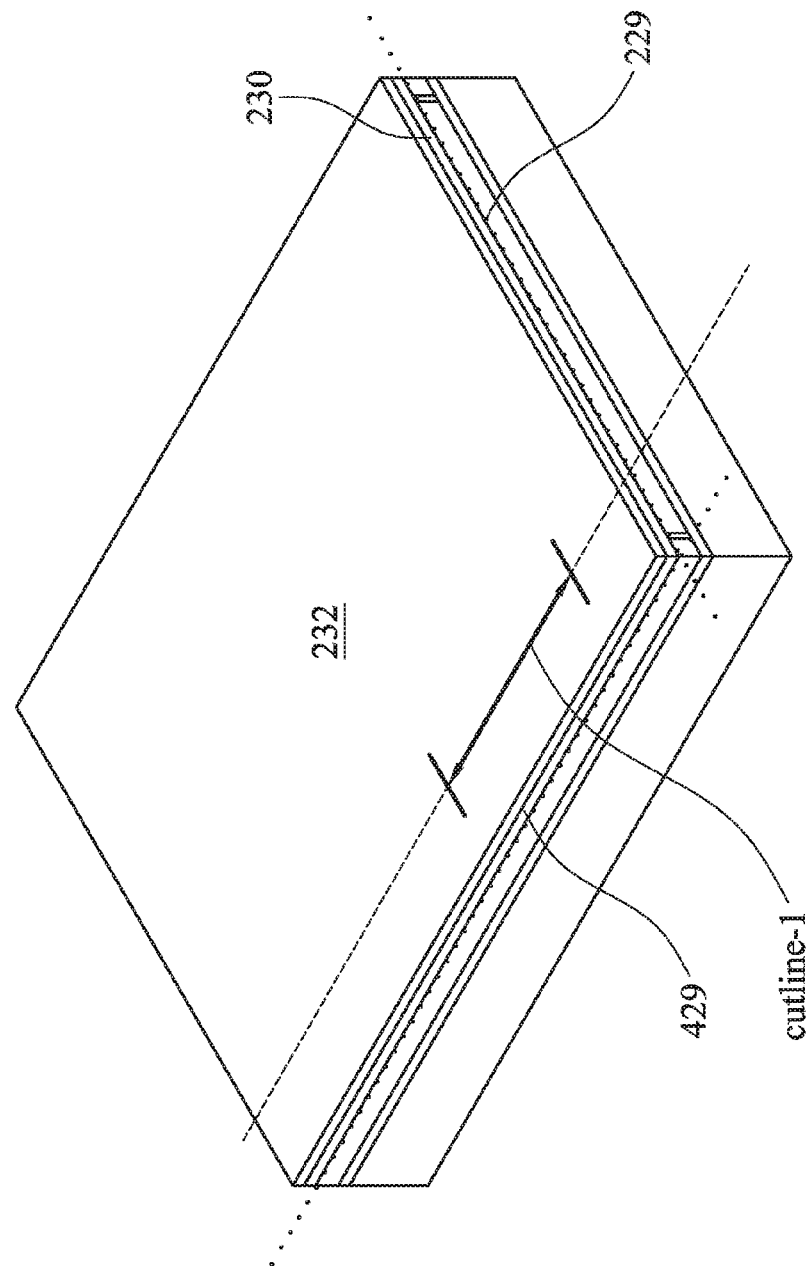
FIG. 13A depicts an isometric view of the semiconductor structure after wafer bonding operations.
Figure 13B:
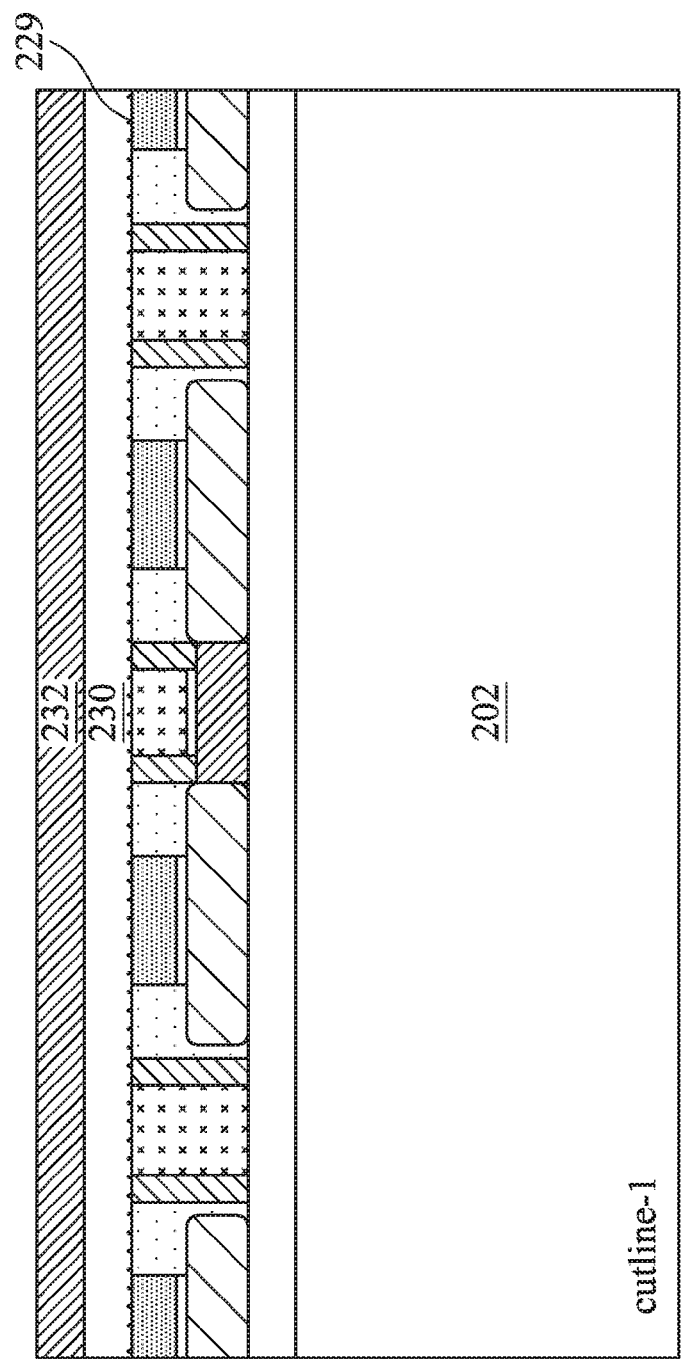
FIG. 13B provides a cross-sectional view of the semiconductor structure from cutline 1 of FIG. 13A.

FIG. 13A depicts an isometric view of the semiconductor structure after wafer bonding (e.g., operation 104 of FIG. 4) is complete. FIG. 13B provides a cross-sectional view of the semiconductor structure from cutline 1 of FIG. 13A. These figures show a second buried oxide 230 with second channel material 232 bonded to the top patterned surface 229 of the first transistor layer.

Figure 5:
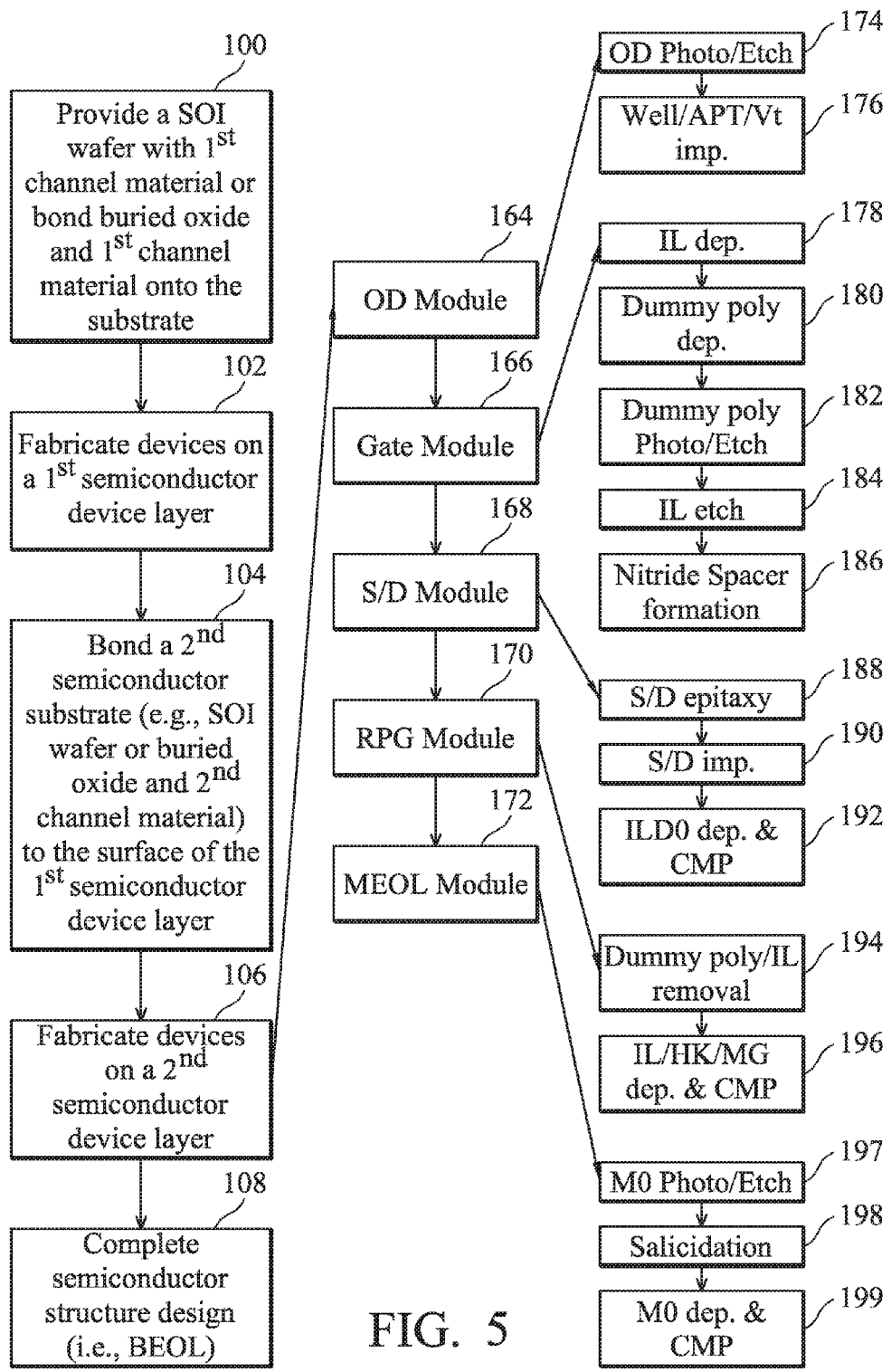
FIG. 5 is a process flow chart depicting another example method for creating a multi-layer semiconductor structure having two semiconductor device layers.

FIG. 5 is a process flow chart depicting another example method for creating a multi-layer semiconductor structure having two semiconductor device layers. This example method also comprises providing a SOI wafer or bond buried oxide and first channel material on a substrate (operation 100), fabricating the first semiconductor layer with an exposed patterned top surface (operation 102), bonding the bottom insulator surface of a SOI substrate (or bond buried oxide and channel material) to the top patterned surface of the first semiconductor layer (operation 104), fabricating the second device layer on the SOI substrate (operation 106), and completing the semiconductor structure with wiring and metallization layers (operation 108). The example method of FIG. 5 is similar to the example method of FIG. 2, but provides specific examples regarding how the second semiconductor layer may be fabricated.

In particular, fabrication of devices in the second semiconductor device layer, in this example, comprises an oxidation ("OD") module process (operation 164), a gate module process (operation 166), a source/drain module process (operation 168), a remove poly gate module process (operation 170), and a middle end of line ("MEOL") module process (operation 172).

The OD module process (operation 148) may comprise a number of iterations of isolation oxide deposition and planarizing, photolithography and etching operations (operation 174), and diffusion/ion implantation operations (operation 176) such as P-well or N-well implantation, P+ implantation, and N+ implantation.

The gate module process (operation 150) comprises operations such as depositing isolation oxide material (operation 178), dummy poly deposition (operation 180), dummy poly photolithography/etching (operation 182), etching isolation oxide material (operation 184), and nitride spacer formation (operation 186).

The source/drain module process (operation 152), may comprise source/drain epitaxial growth operations (operation 188), source/drain implantation operations (operation 190), and interlayer dielectric deposition and etching (operation 192).

The remove poly gate module process (operation 170) comprises dummy poly/isolation oxide removal (operation 194) and isolation oxide/high K/metal gate deposition and CMP (operation 196).

The middle end of line ("MEOL") module process (operation 154), may comprise M0 photolithography and etching operations (operation 197), salicidation (operation 198), and M0 deposition and CMP (operation 199).

Figure 14A:
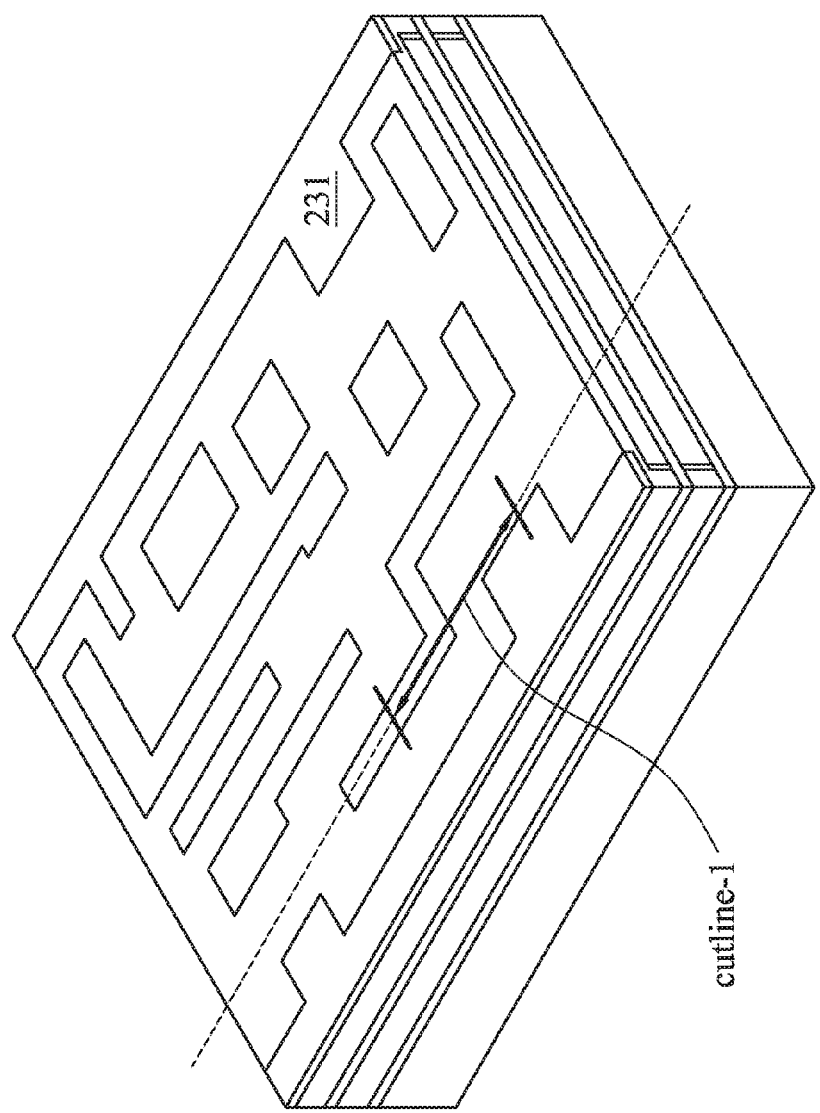
FIG. 14A depicts an isometric view of a semiconductor structure after BEOL operations.
Figure 14B:
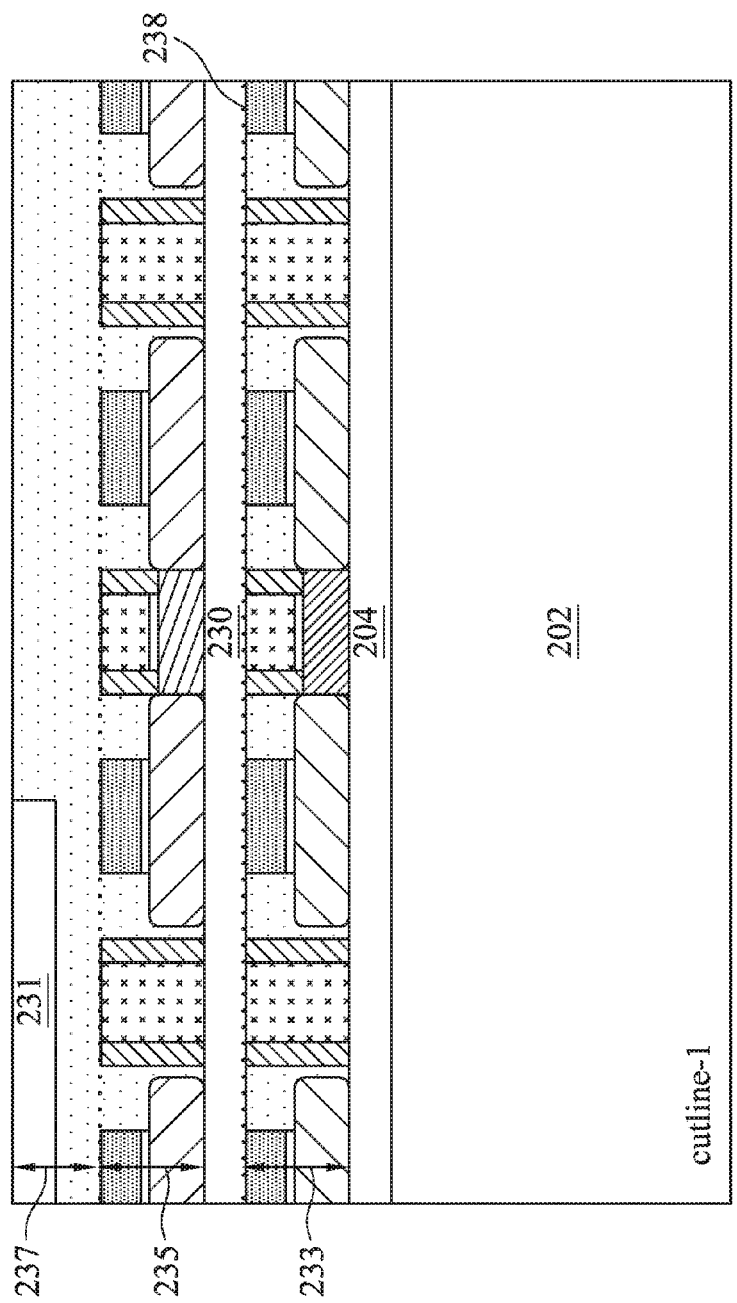
FIG. 14B provides a cross-sectional view of the semiconductor structure from cutline 1 of FIG. 14A.

After the second semiconductor device layer is fabricated, BEOL operations may take place. FIG. 14A depicts an isometric view of the semiconductor structure after the BEOL operations (e.g., operation 108 of FIG. 5), including the addition of a M1 metal 231, are complete. FIG. 14B provides a cross-sectional view of the semiconductor structure from cutline 1 of FIG. 14A. These figures show the first buried oxide layer 204 above the substrate 202, a first transistor layer 233 above the buried oxide 204, a second buried oxide layer 230 above the first transistor layer 233, a second transistor layer 235 above the second buried oxide 230, and a back-end-of-line ("BEOL") layer 237 above the second transistor layer 235. A bonding surface 238 comprises the top surface 229 of the first transistor layer 233 and the bottom surface of the second buried oxide layer 230.

The patterned top surface of the first transistor layer 233 is arranged in a manner that allows for the second buried oxide 230 to be bonded thereto without the need for a glue/buffer region between the patterned surface of the first transistor layer 233 and the second buried oxide 230. By appropriately designing and controlling the pattern densities of gate metal material, the M0 metal material, and the ILD0 oxide on the top surface of the first transistor layer 233, the atom link between the buried oxide and top surface of first device layer may be sufficiently strong.

Figure 15:
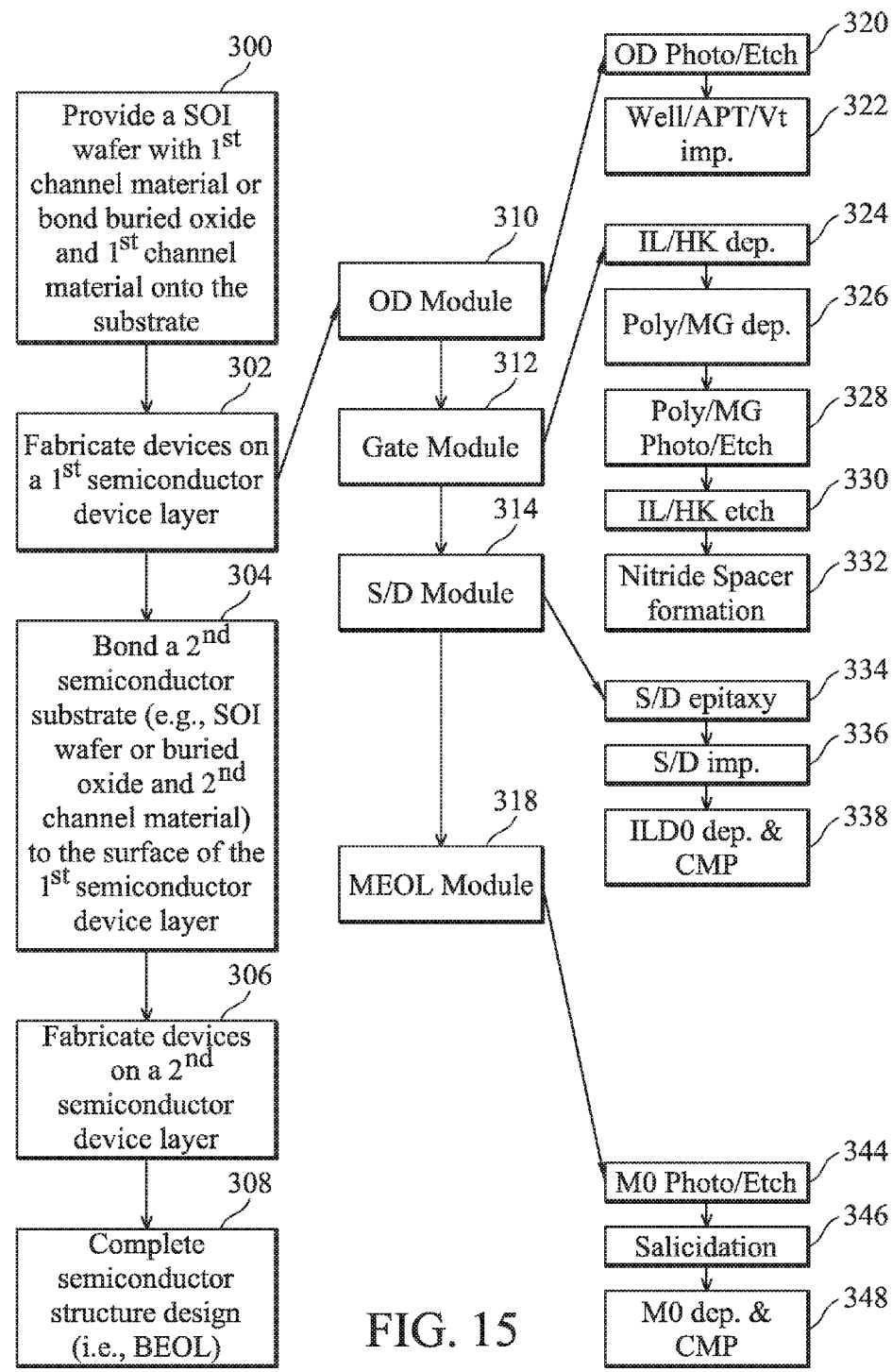
FIG. 15 is a process flow chart depicting another example method for creating a multi-layer semiconductor structure having two semiconductor device (or transistor) layers.

FIG. 15 is a process flow chart depicting another example method for creating a multi-layer semiconductor structure having two semiconductor device (or transistor) layers. At operation 300, a first semiconductor-on-insulator ("SOI") wafer with a first channel material is provided for the first layer. Alternatively, at operation 300, a substrate with bond buried oxide and the first channel material may be provided.

At operation 302, the first transistor layer is fabricated. The first semiconductor layer may be fabricated using a number of using suitable processes including photolithography, etching, cleaning, chemical mechanical polishing/planarization ("CMP"), thin film deposition, thermal process, epitaxy, and material filling, among others. The fabrication of the first level comprises designing the layer such that the pattern density of the ILD0 oxide region is greater than 40%. Alternatively, fabrication of the first level comprises designing the layer such that the pattern density for the gate region is less than 28% and the pattern density for the M0 region is less than 29%.

After the devices on the first semiconductor layer are fabricated, a second semiconductor substrate is provided and bonded to the patterned top surface of the first semiconductor device layer (operation 304). The second semiconductor substrate comprises a semiconductor on insulator ("SOI") substrate. The bottom surface of the insulator of the SOI substrate is bonding to the top surface of the first semiconductor layer.

After bonding, a second semiconductor device layer is fabricated on the second semiconductor substrate (operation 306). The second semiconductor layer may be fabricated using a number of using suitable processes including photolithography, etching, cleaning, chemical mechanical polishing/planarization ("CMP"), thin film deposition, thermal process, epitaxy, and material filling, among others.

The second semiconductor substrate has a semiconductor on insulator ("SOI") structure comprising a buried oxide and a second channel material. The buried oxide functions as an electrical insulator underneath the semiconductor channel material. The buried oxide may be formed from material such as $SiO_2$, HfO, $Al_2O_3$ or other suitable oxide material. The electrical insulator functions to insulate the second channel material in the second semiconductor substrate from the devices formed on the first semiconductor device layer.

The second channel material may be formed from material such as Si, SiGe, GaAs, or others. The second channel material may be the same as or different from the semiconductor channel material used in the first semiconductor device layer. This can allow for selectively constructing certain semiconductor devices with the channel material of the first semiconductor substrate and other semiconductor devices with the channel material of the second semiconductor substrate. For example, the channel material of the first semiconductor substrate may be Ge and used for fabricating PMOS devices, and the channel material of the second semiconductor substrate may be GaAs and used for fabricating NMOS devices for boosting the performance of NMOS and PMOS transistors.

After fabricating the second semiconductor device layer, the semiconductor structure can be completed (operation 308). Completion comprises back end of line ("BEOL") operations where the individual devices are interconnected with wiring on the multi-layer semiconductor structure. BEOL may include fabrication of contacts, insulating layers (dielectrics), metal levels, and bonding sites for chip-to-package connections.

In particular, fabrication of devices in the first semiconductor device layer, in this example, comprises an oxidation ("OD") module process (operation 310), a gate module process (operation 312), a source/drain module process (operation 314), and a middle end of line ("MEOL") module process (operation 318).

The OD module process (operation 310) may comprise a number of iterations of isolation oxide deposition and planarizing, photolithography and etching operations (operation 320), and diffusion/ion implantation operations (operation 322) such as P-well or N-well implantation, $P^+$ implantation, and $N^+$ implantation.

The gate module process (operation 312) comprises operations such as depositing isolation oxide material (operation 324), dummy poly deposition (operation 326), dummy poly photolithography/etching (operation 328), etching isolation oxide material (operation 330), and nitride spacer formation (operation 332).

Figure 18A:
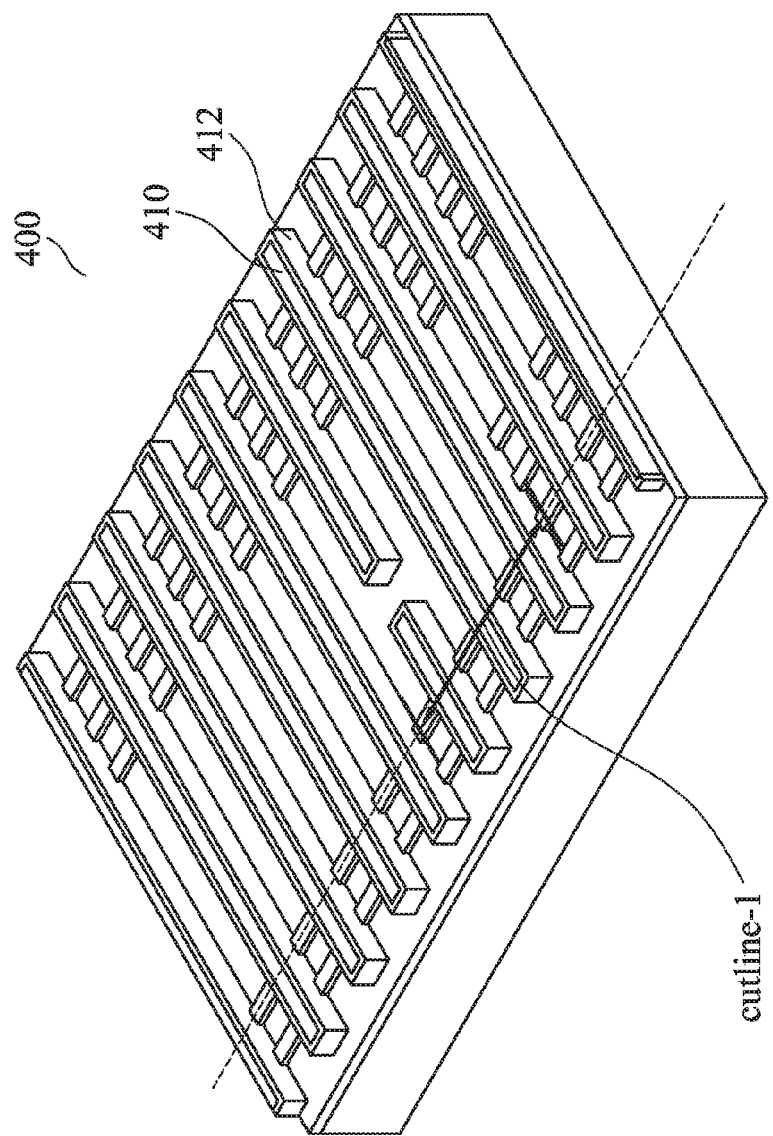
FIG. 18A depicts an isometric view of an example semiconductor structure after completion of a gate module process.
Figure 18B:
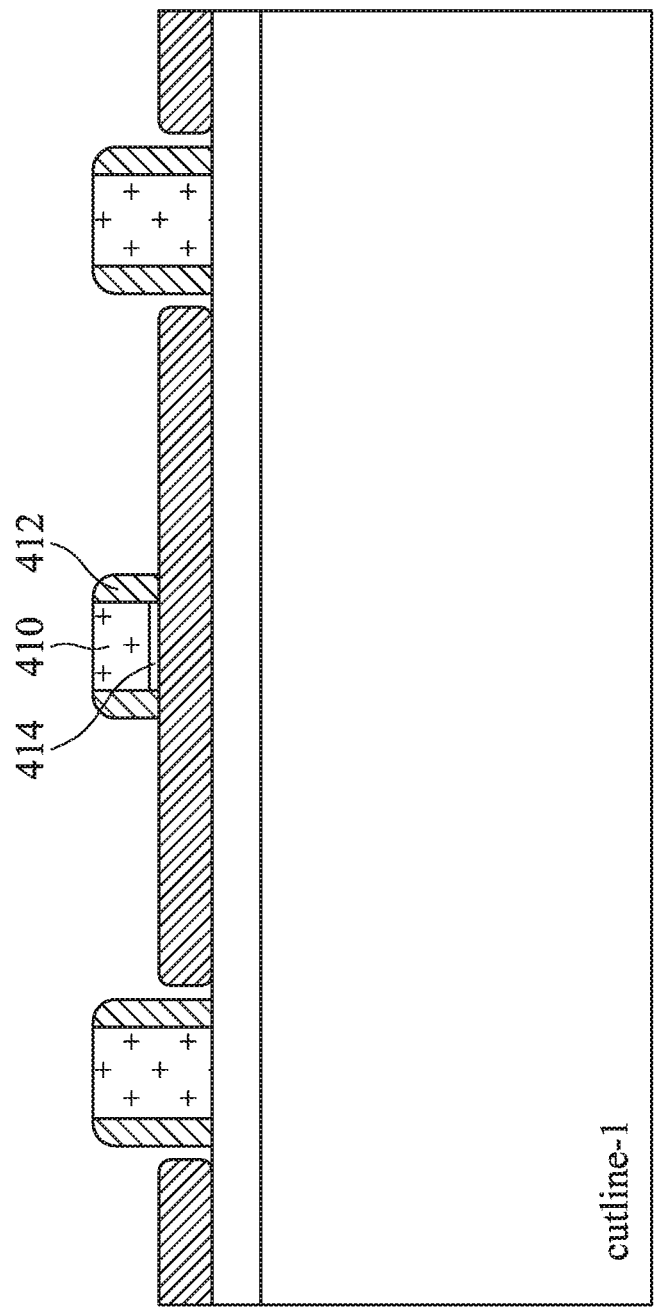
FIG. 18B provides a cross-sectional view of the semiconductor structure from cutline 1 of FIG. 18A.

FIG. 18A depicts an isometric view of the example semiconductor structure after completion of the gate module process (operation 312 of FIG. 15). FIG. 18B provides a cross-sectional view of the semiconductor structure from cutline 1 of FIG. 18A. Shown are dummy poly 410, nitride spacers 412, and dummy isolation oxide 414.

Referring back to FIG. 15, the source/drain module process (operation 314) may comprise source/drain epitaxial growth operations (operation 334), source/drain implantation operations (operation 336), and interlayer dielectric deposition and etching (operation 338).

Figure 19A:
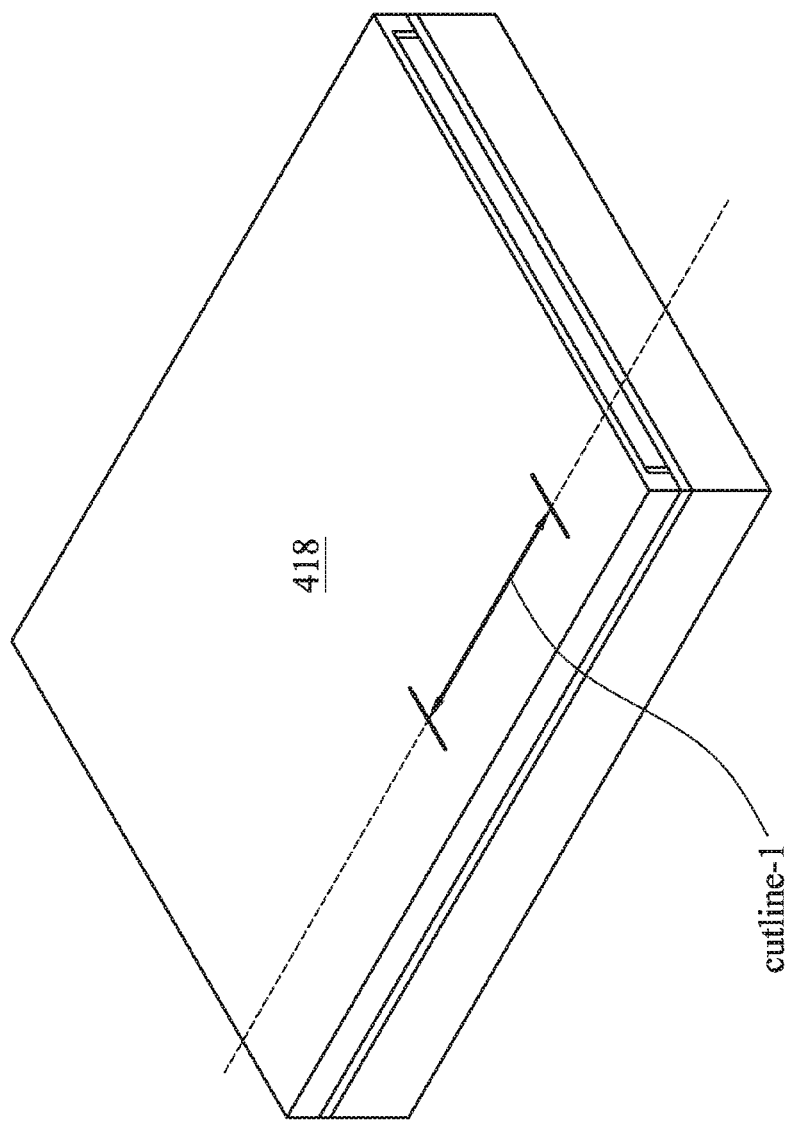
FIG. 19A depicts an isometric view of a semiconductor structure after source/drain module completion.
Figure 19B:
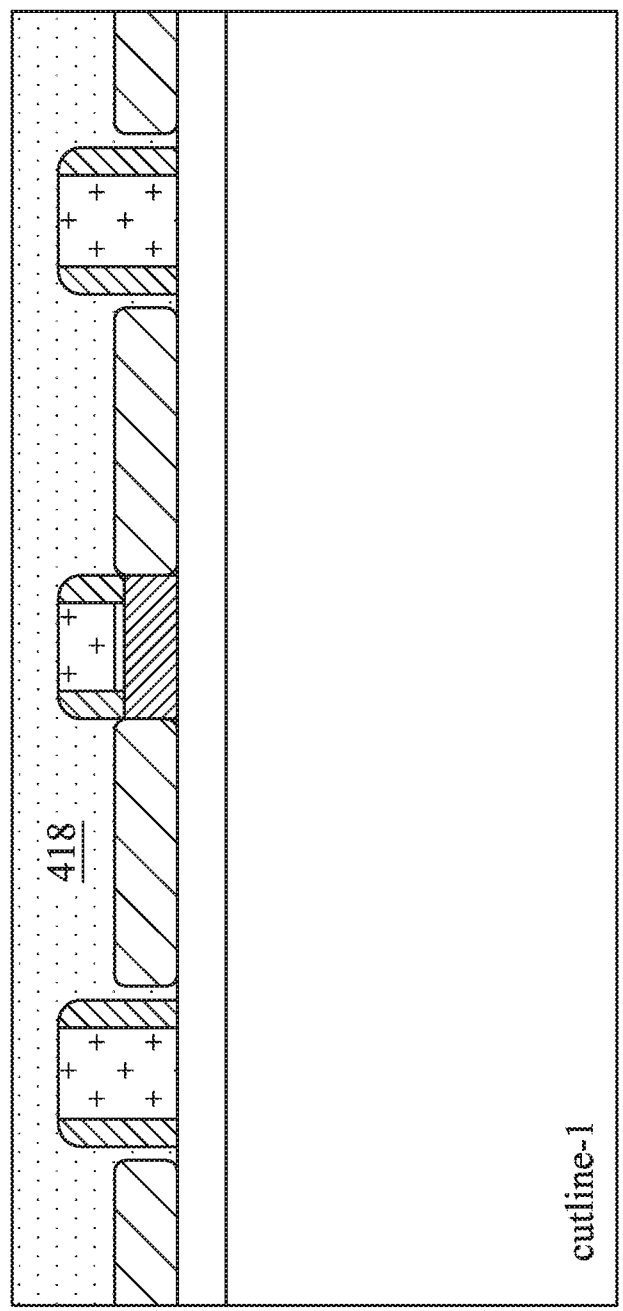
FIG. 19B provides a cross-sectional view of the semiconductor structure from cutline 1 of FIG. 19A.

FIG. 19A depicts an isometric view of the semiconductor structure after source/drain module completion (operation 314 of FIG. 15). FIG. 19B provides a cross-sectional view of the semiconductor structure from cutline 1 of FIG. 19A. Shown is the deposited interlayer dielectric material 418.

Referring back to FIG. 15, the MEOL module process (operation 122) may comprise M0 photolithography and etching operations (operation 344), salicidation (operation 346), and M0 deposition and CMP (operation 348).

Figure 20A:
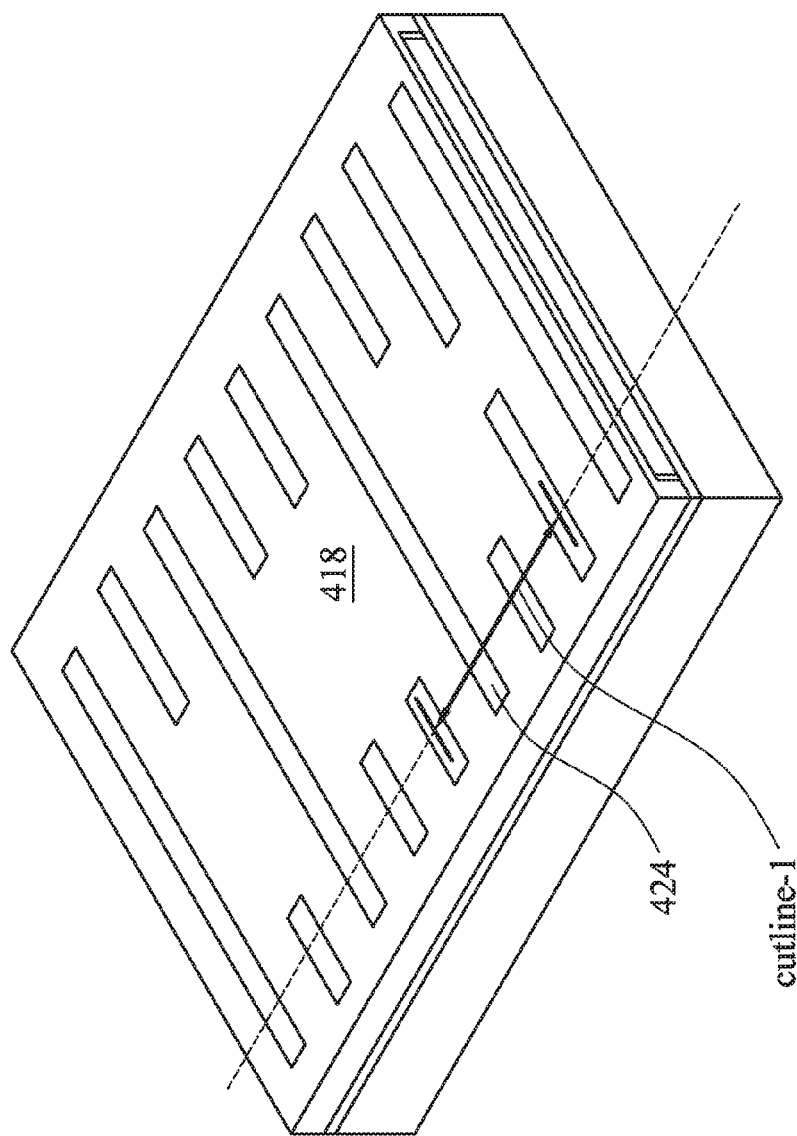
FIG. 20A depicts an isometric view of a semiconductor structure after a MEOL module process.
Figure 20B:
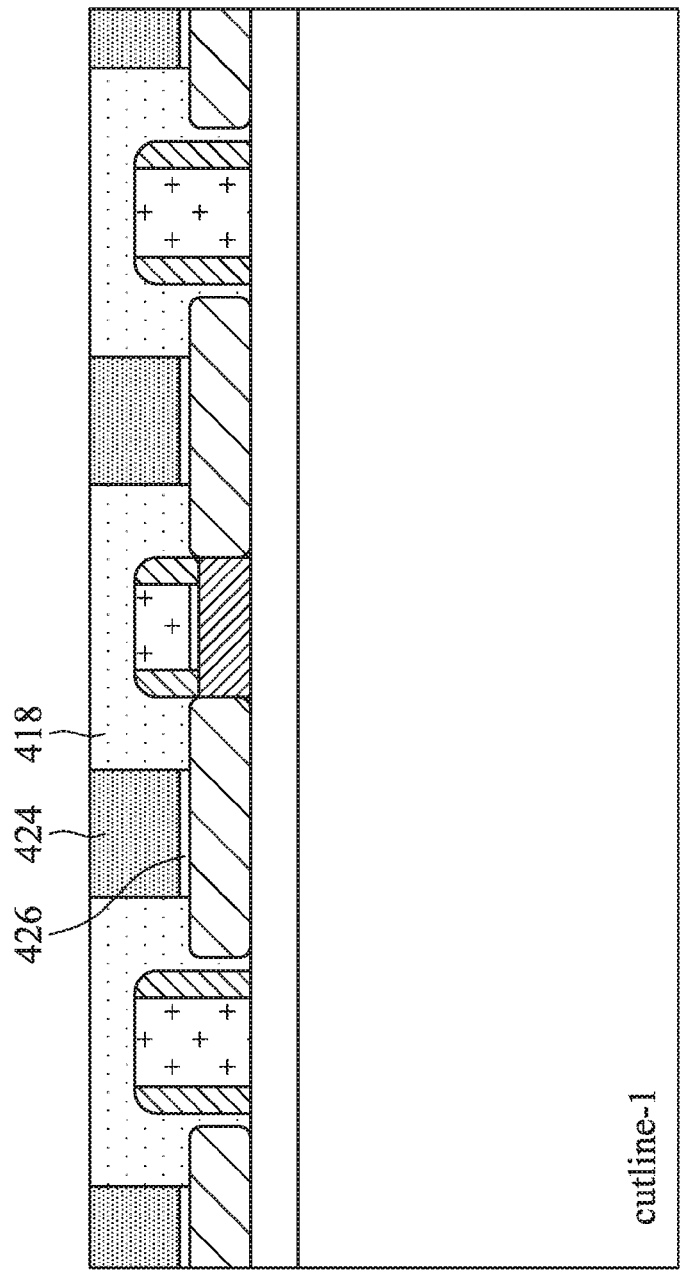
FIG. 20B provides a cross-sectional view of the semiconductor structure from cutline 1 of FIG. 20A.

FIG. 20A depicts an isometric view of the semiconductor structure after the MEOL module process (operation 318 of FIG. 15). FIG. 20B provides a cross-sectional view of the semiconductor structure from cutline 1 of FIG. 20A. These figures show the addition of M0 metal material 424 above source and drain regions and also shows that silicide 426 between the M0 metal and the source and drain regions.

The local density of the ILD0 oxide 418 throughout the chip as measured by an arbitrary 1 um×1 um rectangle 428 should be larger than 40%. The ILD0 oxide can provide a stronger atom link to the bonding surface. In this embodiment, M0 metal 424 and MG gate metal 420 are appropriately designed and surrounded by ILD0 oxide to avoid large regions without ILD0 oxide.

Figure 16:
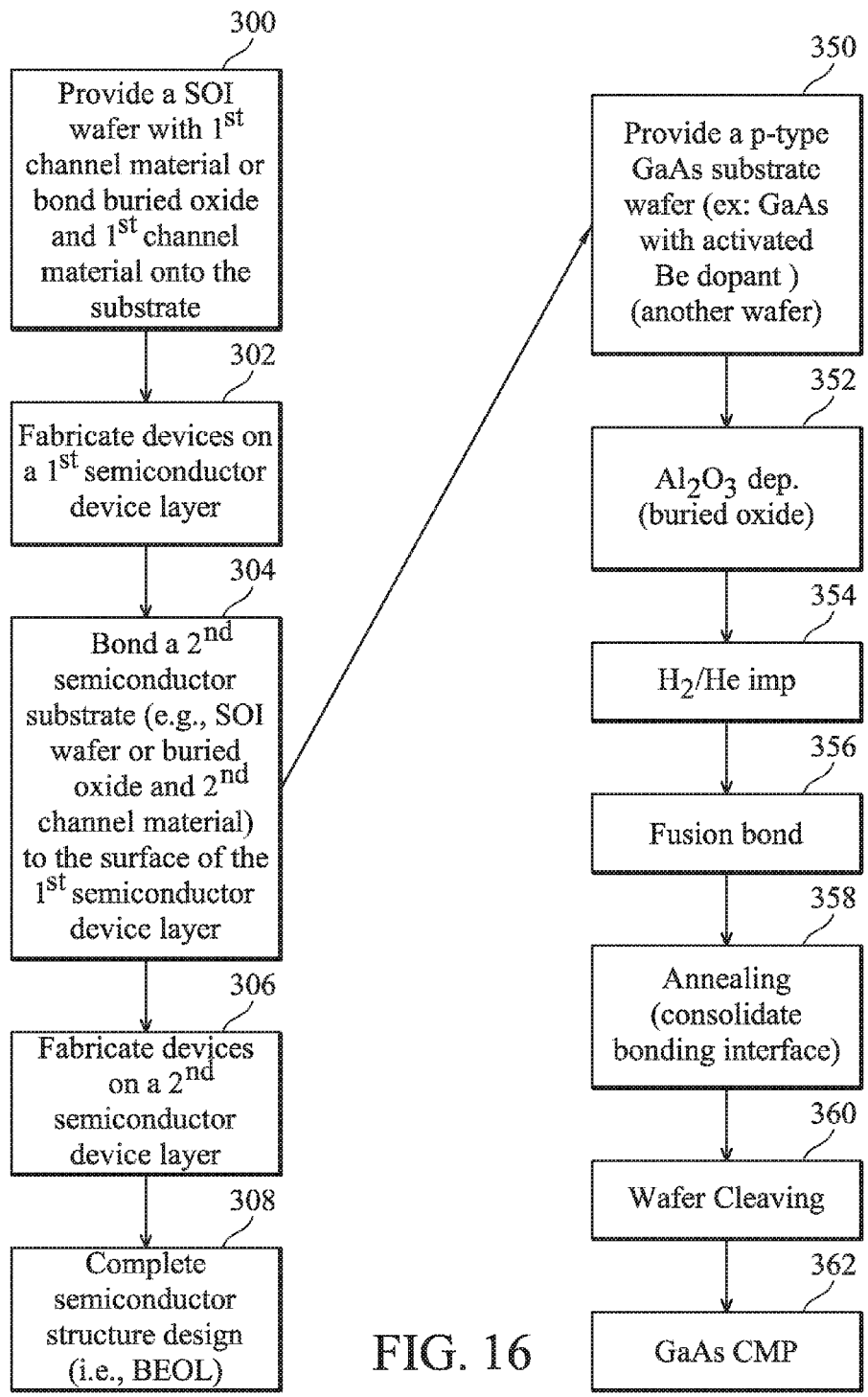
FIG. 16 is a process flow chart depicting another example method for creating a multi-layer semiconductor structure having two semiconductor device layers.

FIG. 16 is a process flow chart depicting another example method for creating a multi-layer semiconductor structure having two semiconductor device layers. This example method comprises providing a SOI wafer or bond buried oxide and first channel material on a substrate (operation 300), fabricating the first semiconductor layer with an exposed patterned top surface (operation 302), bonding the bottom insulator surface of a SOI substrate (or bond buried oxide and channel material) to the top patterned surface of the first semiconductor layer (operation 304), fabricating the second device layer on the SOI substrate (operation 306), and completing the semiconductor structure with wiring and metallization layers (operation 308). The example method of FIG. 16 is similar to the example method of FIG. 15, but provides specific examples regarding how the second semiconductor substrate may be bonded to the surface of the first semiconductor device.

In particular, referring to FIG. 16, bonding the bottom insulator surface of a SOI substrate (or bond buried oxide and channel material) to the top patterned surface of the first semiconductor layer, in this example, comprises providing a p-type GaAs substrate wafer (operation 350), which will provide the second channel material. As an example, the substrate may comprise GaAs with an activated Be dopant. The example further comprises depositing a defect free buried oxide layer (operation 352) onto the substrate. In this example, the buried oxide comprises Al2O3, HfO2, SiO2, or some other suitable oxide material. In this example, the thickness of this layer is about 10 nm~20 nm. The example further comprises H2/He implantation (operation 354). The deposited buried oxide and substrate are subjected to H2/He implantation to introduce the H2/He into the GaAs substrate to a level to weaken the interface atom linkage.

At operation 356, bonding the top surface of the buried oxide layer onto the top patterned surface of the first transistor level takes place. The surface of the buried oxide layer opposite the second channel material is bonded to the top patterned surface of the first transistor layer. The two bonding surfaces should be planarized to minimize the surface roughness and cleaned to remove particles before bonding. The example further comprises annealing operations to consolidate the bonding interface (operation 358). The example further comprises wafer cleaving (operation 360) at the H2/He implantation layer level. The substrate can be cleaved at the H2/He implantation layer level. The example further comprises GaAs CMP (operation 362) to reduce the size of the GaAs substrate. CMP for the GaAs channel material is undertaken to get the second channel material to a targeted thickness.

Figure 21A:
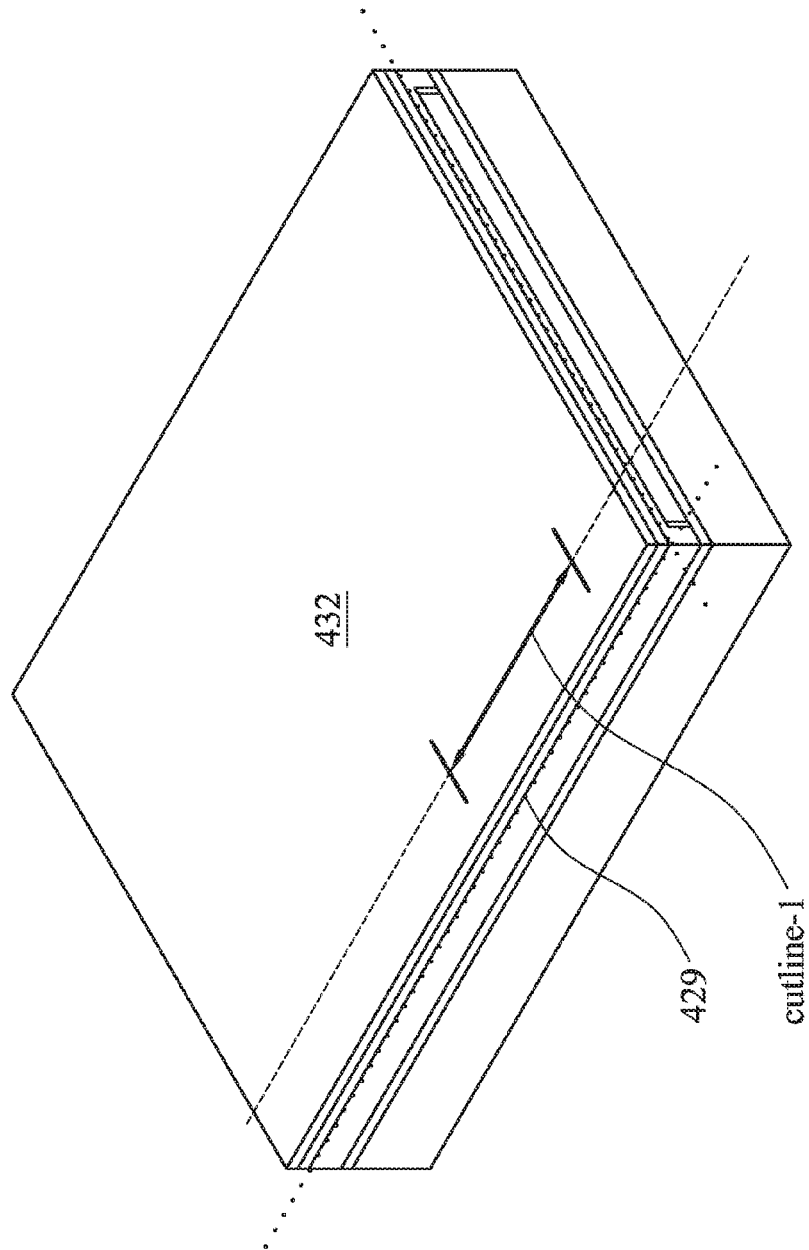
FIG. 21A depicts an isometric view of the semiconductor structure after wafer bonding operations.
Figure 21B:
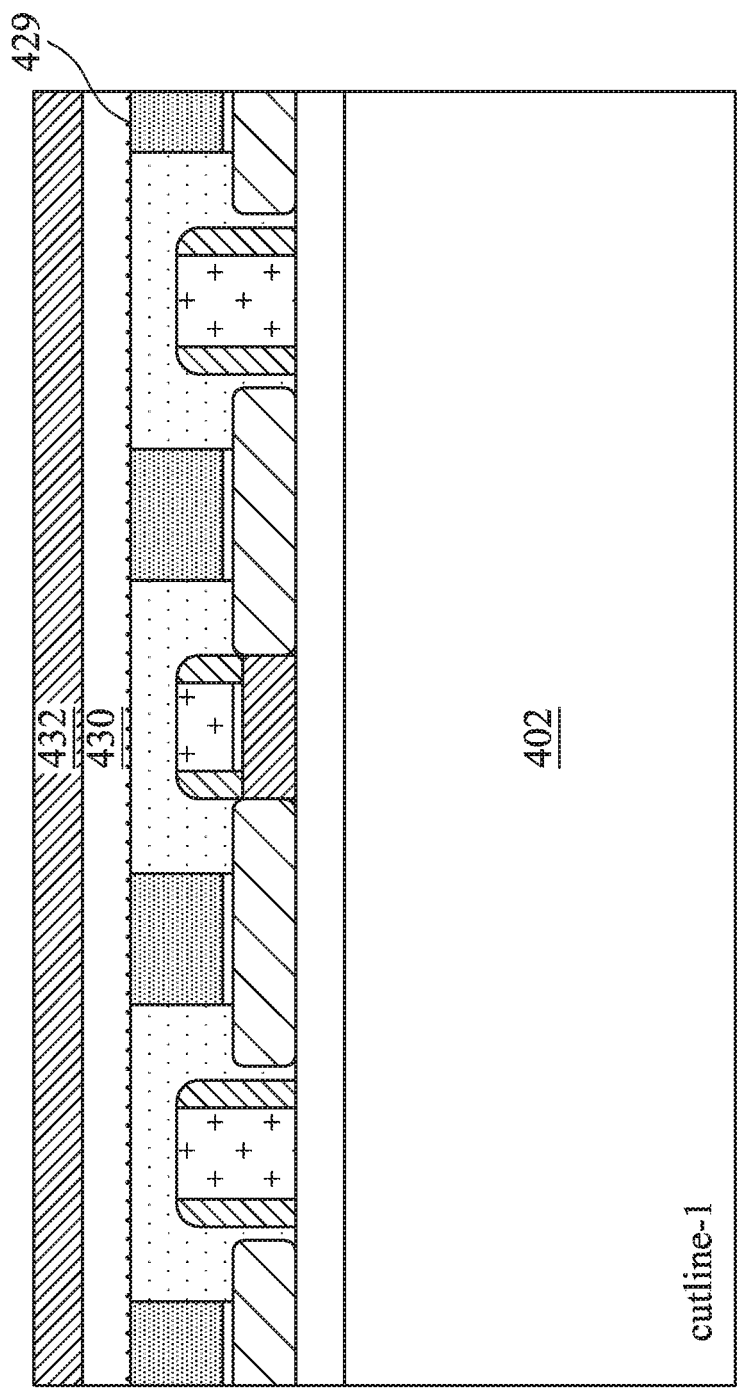
FIG. 21B provides a cross-sectional view of the semiconductor structure from cutline 1 of FIG. 21A.

FIG. 21A depicts an isometric view of the semiconductor structure after wafer bonding (e.g., operation 304 of FIG. 16) is complete. FIG. 21B provides a cross-sectional view of the semiconductor structure from cutline 1 of FIG. 21A. These figures show a second buried oxide 430 with second channel material 432 bonded to the top patterned surface 429 of the first transistor layer.

Figure 17:
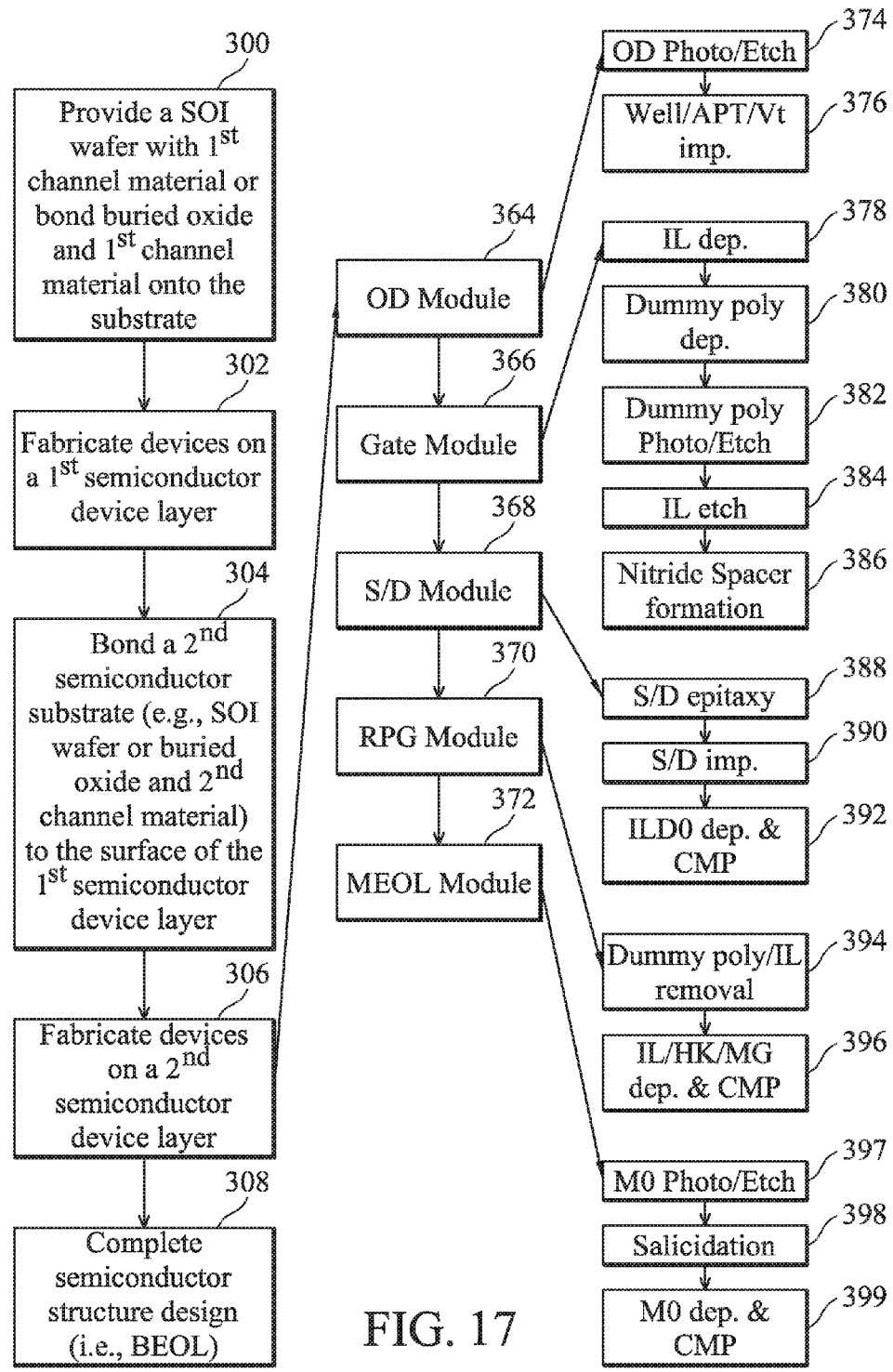
FIG. 17 is a process flow chart depicting another example method for creating a multi-layer semiconductor structure having two semiconductor device layers.

FIG. 17 is a process flow chart depicting another example method for creating a multi-layer semiconductor structure having two semiconductor device layers. This example method comprises providing a SOI wafer or bond buried oxide and first channel material on a substrate (operation 300), fabricating the first semiconductor layer with an exposed patterned top surface (operation 302), bonding the bottom insulator surface of a SOI substrate (or bond buried oxide and channel material) to the top patterned surface of the first semiconductor layer (operation 304), fabricating the second device layer on the SOI substrate (operation 306), and completing the semiconductor structure with wiring and metallization layers (operation 308). The example method of FIG. 17 is similar to the example method of FIG. 15, but provides specific examples regarding how the second semiconductor layer may be fabricated.

In particular, fabrication of devices in the second semiconductor device layer, in this example, comprises an oxidation ("OD") module process (operation 364), a gate module process (operation 366), a source/drain module process (operation 368), a remove poly gate module process (operation 370), and a middle end of line ("MEOL") module process (operation 372).

The OD module process (operation 364) may comprise a number of iterations of isolation oxide deposition and planarizing, photolithography and etching operations (operation 374), and diffusion/ion implantation operations (operation 376) such as P-well or N-well implantation, P+ implantation, and N+ implantation.

The gate module process (operation 366) comprises operations such as depositing isolation oxide material (operation 378), dummy poly deposition (operation 380), dummy poly photolithography/etching (operation 382), etching isolation oxide material (operation 384), and nitride spacer formation (operation 386).

The source/drain module process (operation 368), may comprise source/drain epitaxial growth operations (operation 388), source/drain implantation operations (operation 390), and interlayer dielectric deposition and etching (operation 392).

The remove poly gate module process (operation 370) comprises dummy poly/isolation oxide removal (operation 394) and isolation oxide/high K/metal gate deposition and CMP (operation 396).

The middle end of line ("MEOL") module process (operation 372), may comprise M0 photolithography and etching operations (operation 397), salicidation (operation 398), and M0 deposition and CMP (operation 399).

Figure 22A:
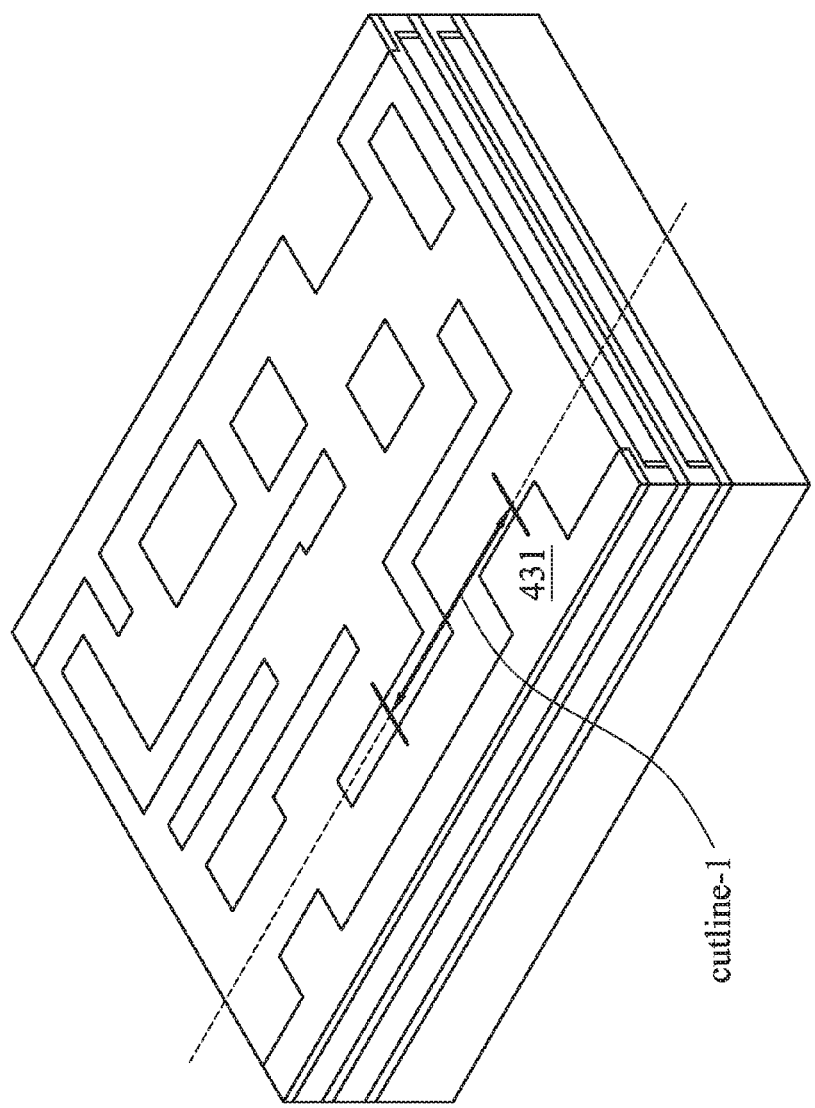
FIG. 22A depicts an isometric view of a semiconductor structure after BEOL operations.
Figure 22:
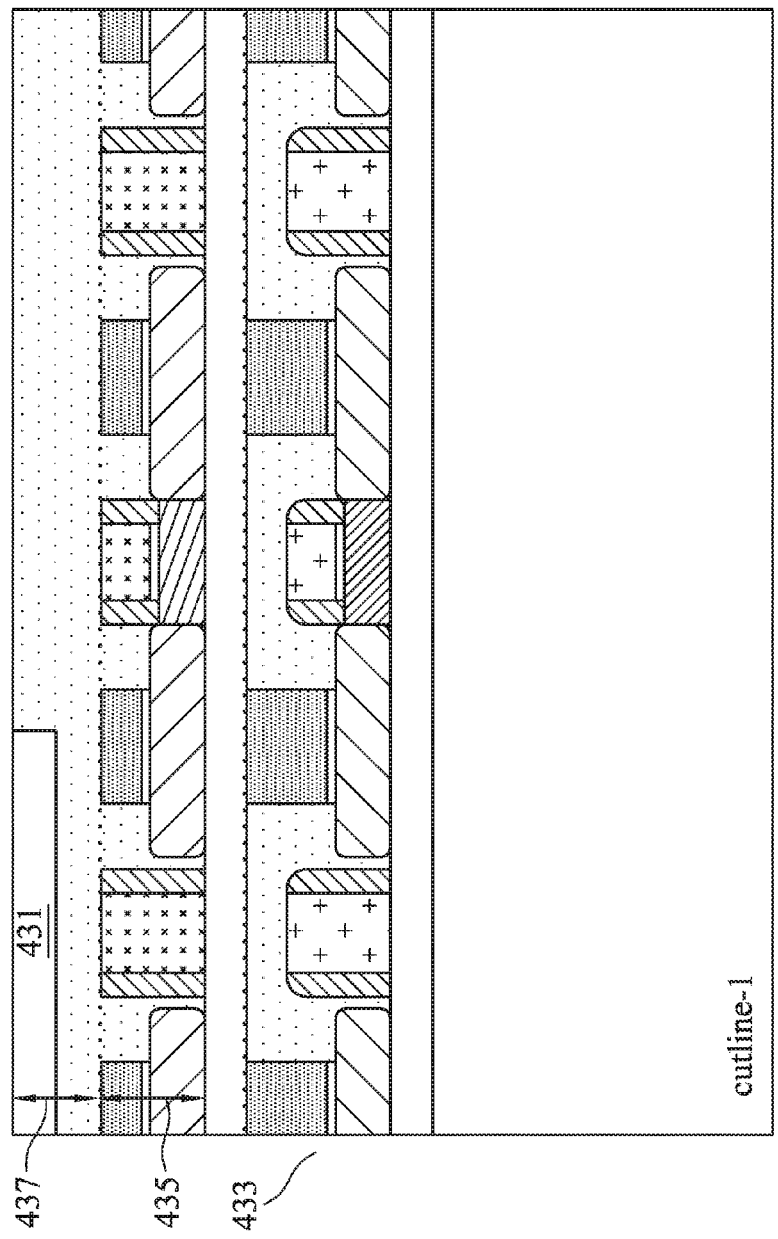
FIG. 22B provides a cross-sectional view of the semiconductor structure from cutline 1 of FIG. 22A.

After the second semiconductor device layer is fabricated, BEOL operations may take place. FIG. 22A depicts an isometric view of the semiconductor structure after the BEOL operations (e.g., operation 308 of FIG. 17), including the addition of a M1 metal 431, are complete. FIG. 22B provides a cross-sectional view of the semiconductor structure from cutline 1 of FIG. 22A. These figures show the first buried oxide layer 404 above the substrate 402, a first transistor layer 433 above the buried oxide 404, a second buried oxide layer 430 above the first transistor layer 433, a second transistor layer 435 above the second buried oxide 430, and a back-end-of-line ("BEOL") layer 437 above the second transistor layer 435. A bonding surface 438 comprises the top surface 429 of the first transistor layer 433 and the bottom surface of the second buried oxide layer 430.

The patterned top surface of the first transistor layer 433 is arranged in a manner that allows for the second buried oxide 430 to be bonded thereto without the need for a glue/buffer region between the patterned surface of the first transistor layer 433 and the second buried oxide 430. By appropriately designing and controlling the pattern densities of gate metal material, the M0 metal material, and the ILD0 oxide on the top surface of the first transistor layer 433, the atom link between the buried oxide and top surface of first device layer may be sufficiently strong.

This written description uses examples to disclose the invention, include the best mode, and also to enable a person skilled in the art to make and use the invention. The patentable scope of the invention may include other examples that occur to those skilled in the art. For example, a semiconductor structure could comprise three or more semiconductor device layers wherein the first semiconductor device layer includes a SOI substrate and the second, third or more layers include a SOI substrate. In another example, a semiconductor structure with multiple semiconductor device layers could include one layer containing PMOS devices and another layer containing NMOS devices. This written description provided an example of a patterned surface. In another embodiment the patterned surface may include other materials and material combinations. In other embodiments, the patterned surface may include other shapes of patterns on the bonding surface.

One of ordinary skill in the art will recognize that the various embodiments may be practiced without one or more of the specific details, or with other replacement and/or additional methods, materials, or components. Well-known structures, materials, or operations may not be shown or described in detail to avoid obscuring aspects of various embodiments of the invention. Various embodiments shown in the figures are illustrative example representations and are not necessarily drawn to scale. Particular features, structures, materials, or characteristics may be combined in any suitable manner in one or more embodiments. Various additional layers and/or structures may be included and/or described features may be omitted in other embodiments. Various operations may be described as multiple discrete operations in turn, in a manner that is most helpful in understanding the invention. However, the order of description should not be construed as to imply that these operations are necessarily order dependent. In particular, these operations need not be performed in the order of presentation. Operations described herein may be performed in a different order, in series or in parallel, than the described embodiment. Various additional operations may be performed and/or described. Operations may be omitted in additional embodiments.

This written description and the following claims may include terms, such as left, right, top, bottom, over, under, upper, lower, first, second, etc. that are used for descriptive purposes only and are not to be construed as limiting. For example, terms designating relative vertical position may refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and may still fall within the meaning of the term "top." The term "on" as used herein (including in the claims) may not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the art will recognize various equivalent combinations and substitutions for various components shown in the figures.

What is claimed is:

1. A method of fabricating a multilayer semiconductor device structure, comprising:
    providing a first wafer comprising first channel material bonded to a first buried oxide layer;
    fabricating a first semiconductor device layer from the first channel material, the first semiconductor device layer comprising a patterned top surface, the patterned top surface comprising insulator material and conductor material, wherein a pattern density of the insulator material is greater than 40 percent;
    providing a second wafer comprising second channel material bonded to a second buried oxide layer;
    bonding the second buried oxide layer to the patterned top surface of the first semiconductor device layer;
    fabricating a second semiconductor device layer from the second channel material; and
    interconnecting a feature of the first semiconductor device layer with a feature of the second semiconductor device layer.

2. The method of claim 1, wherein providing a first wafer comprises providing a first silicon on insulator (SOI) wafer.

3. The method of claim 2, wherein providing a second wafer comprises providing a second SOI wafer.

4. The method of claim 1, wherein a pattern density of the conductor material is less than 57 percent.

5. The method of claim 1, wherein the first type of channel material is different from the second type of channel material.

6. The method of claim 1, wherein one type of device is exclusively fabricated on one of the first semiconductor device layer and the second semiconductor device layer and another type of device is exclusively fabricated on the other of the first semiconductor device layer and the second semiconductor device layer.

7. The method of claim 6, wherein the one type of device comprises a PMOS device and the other type of device comprises a NMOS device.

8. A method of fabricating a multilayer semiconductor device structure, comprising:
    providing a first silicon on insulator (SOI) wafer comprising first channel material bonded to a first buried oxide layer;
    fabricating a first semiconductor device layer from the first channel material, the first semiconductor device layer comprising a patterned top surface, the patterned top surface comprising insulator material and conductor material, wherein a pattern density of the conductor material is less than 57 percent;
    providing a second SOI wafer comprising second channel material bonded to a second buried oxide layer;
    bonding the second buried oxide layer to the patterned top surface of the first semiconductor device layer; and
    fabricating a second semiconductor device layer from the second channel material.

9. The method of claim 8, wherein a pattern density of the insulator material is greater than 40 percent.

10. The method of claim 8, wherein the first type of channel material is different from the second type of channel material.

11. The method of claim 8, wherein one type of device is exclusively fabricated on one of the first semiconductor device layer and the second semiconductor device layer and another type of device is exclusively fabricated on the other of the first semiconductor device layer and the second semiconductor device layer.

12. The method of claim 11, wherein the one type of device comprises a PMOS device and the other type of device comprises a NMOS device.

13. A method comprising:
    providing a transistor layer including a substrate; and
    forming a gate material on the substrate, wherein the transistor layer has a patterned top surface that includes a region of the gate material, wherein a pattern density of the region of the gate material is less than 28%.

14. The method of claim 13, wherein the transistor layer further includes a source/drain region, the method further comprising forming a metal material on the source/drain region, wherein the patterned top surface further includes a region of the metal material, wherein a pattern density of the region of the metal material is less than 29%.

15. The method of claim 14, further comprising forming an interlayer dielectric material that surrounds the gate material and the metal material, wherein the patterned top surface further includes a region of the interlayer dielectric material, wherein a pattern density of the region of the interlayer dielectric material is greater than at least one of the pattern density of the region of the gate material and the pattern density of the region of the metal material.

16. The method of claim 13, further comprising bonding a buried oxide to the patterned top surface.

17. The method of claim 16, wherein the bonding a buried oxide to the patterned top surface is performed by a touch and press process.

18. The method of claim 17, wherein the touch and press process is performed by applying a Van der Waals force.

19. The method of claim 16, further comprising forming a second transistor layer on the buried oxide, wherein a distance between the patterned top surface and a bottom surface of the second transistor layer is substantially equal to a thickness of the buried oxide.

20. The method of claim 13, wherein the transistor layer further includes a fin on which the gate material is disposed, the method further comprising forming a spacer that surrounds the gate material.

* * * * *